United States Patent [19]

Chang

[11] Patent Number: 5,446,757
[45] Date of Patent: Aug. 29, 1995

[54] CODE-DIVISION-MULTIPLE-ACCESS-SYSTEM BASED ON M-ARY PULSE-POSITION MODULATED DIRECT-SEQUENCE

[76] Inventor: Chen-Yi Chang, 1001 Ta Hsueh Road, Hsinchu,

[21] Appl. No.: 77,347

[22] Filed: Jun. 14, 1993

[51] Int. Cl.$^6$ ............................ H03K 7/04; H04B 1/00
[52] U.S. Cl. .................................... 375/239; 375/200
[58] Field of Search ............................ 375/23, 1

[56] References Cited

U.S. PATENT DOCUMENTS

| | | | |
|---|---|---|---|
| 5,235,615 | 8/1993 | Omura | 375/205 |
| 5,329,546 | 7/1994 | Lee | 375/205 |
| 5,329,547 | 7/1994 | Ling | 375/206 |

Primary Examiner—Edward L. Coles, Sr.
Assistant Examiner—Allan A. Esposo
Attorney, Agent, or Firm—Ladas & Parry

[57] ABSTRACT

A BPSK-MPP-DS-CDMA system is devised using a pulse position modulated direct sequence technique. Under the same bandwidth, same energy used for one decision, and same bit error rate conditions, if the number of users is less than the period $N_{cp}$ of the pseudorandom sequence signal $PN_p^i(t)$ used in the BPSK-MPP-DS-CDMA system, the multiple access capacities of the binary (M=2), ternary (M=3), quaternary (M=4), and pentary (M=5) BPSK-MPP-DS-CDMA systems according to the present invention are respectively at least 2, 5.34, 13.28, and 26.4 times greater than that of the conventional BPSK-DS-CDMA systems. On the other hand, if the number of users attains $N_{cp}$, the multiple access capacity can not increase any more, however, the bit error rate of the system will be reduced. Furthermore, (M−1)/M transmitting energy is saved.

13 Claims, 19 Drawing Sheets

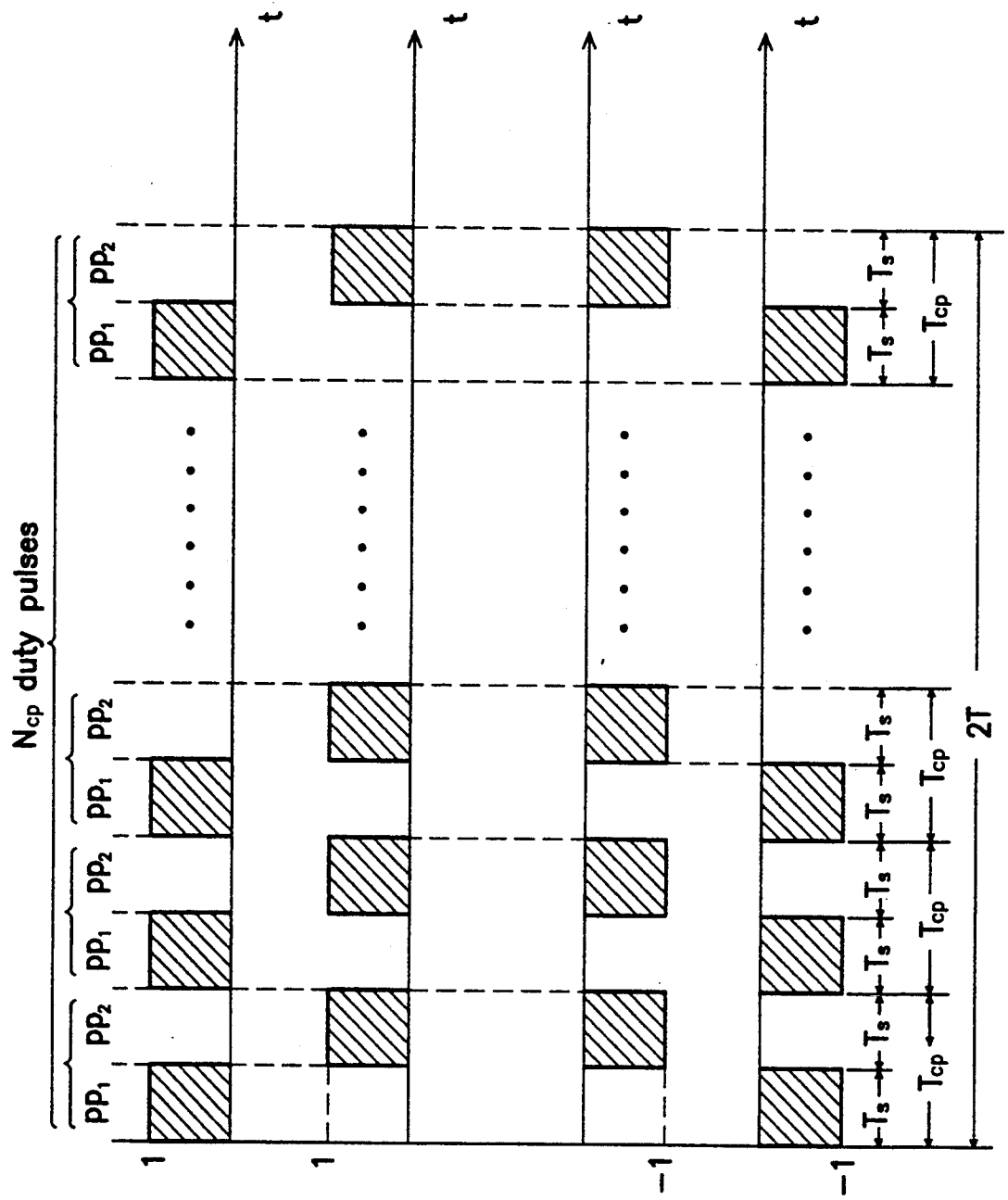

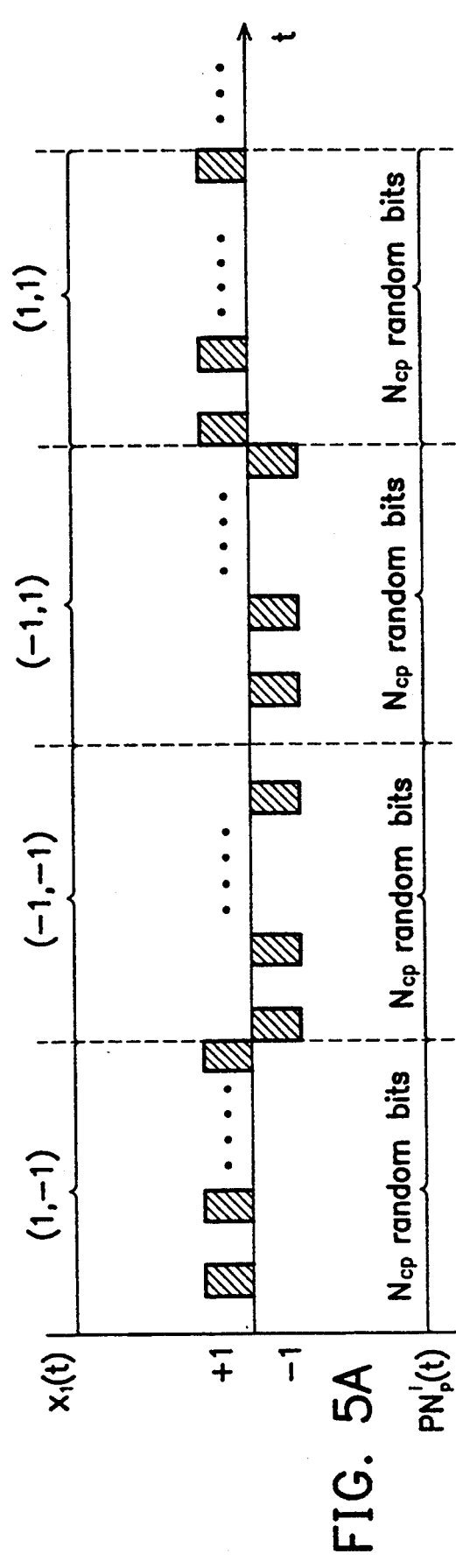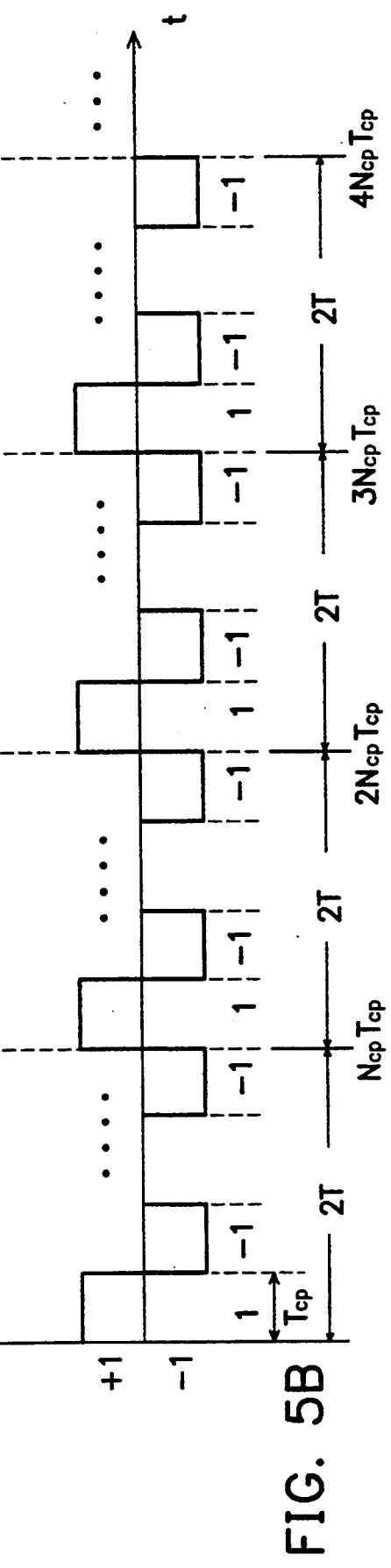
FIG. 5A
FIG. 5B

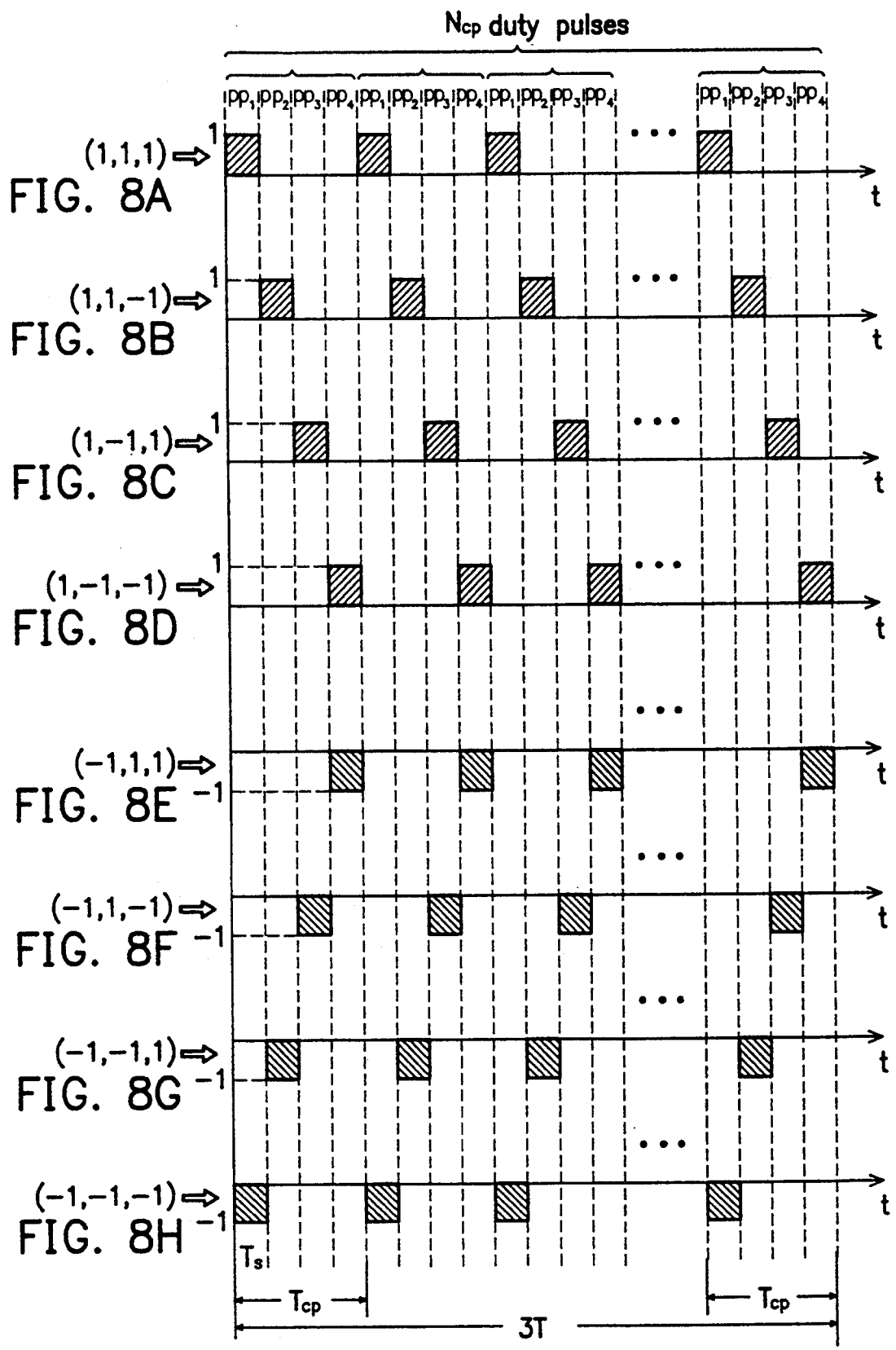

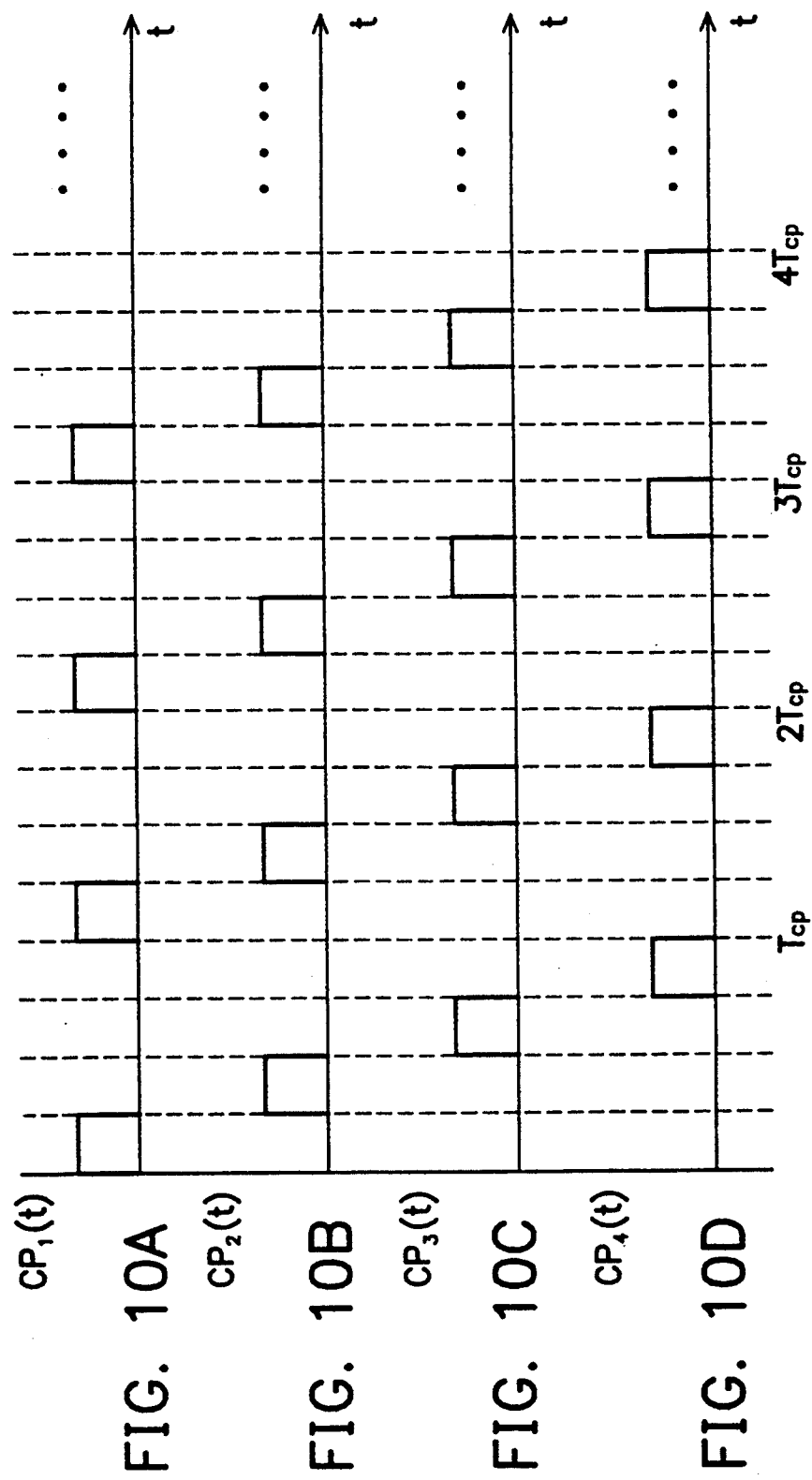

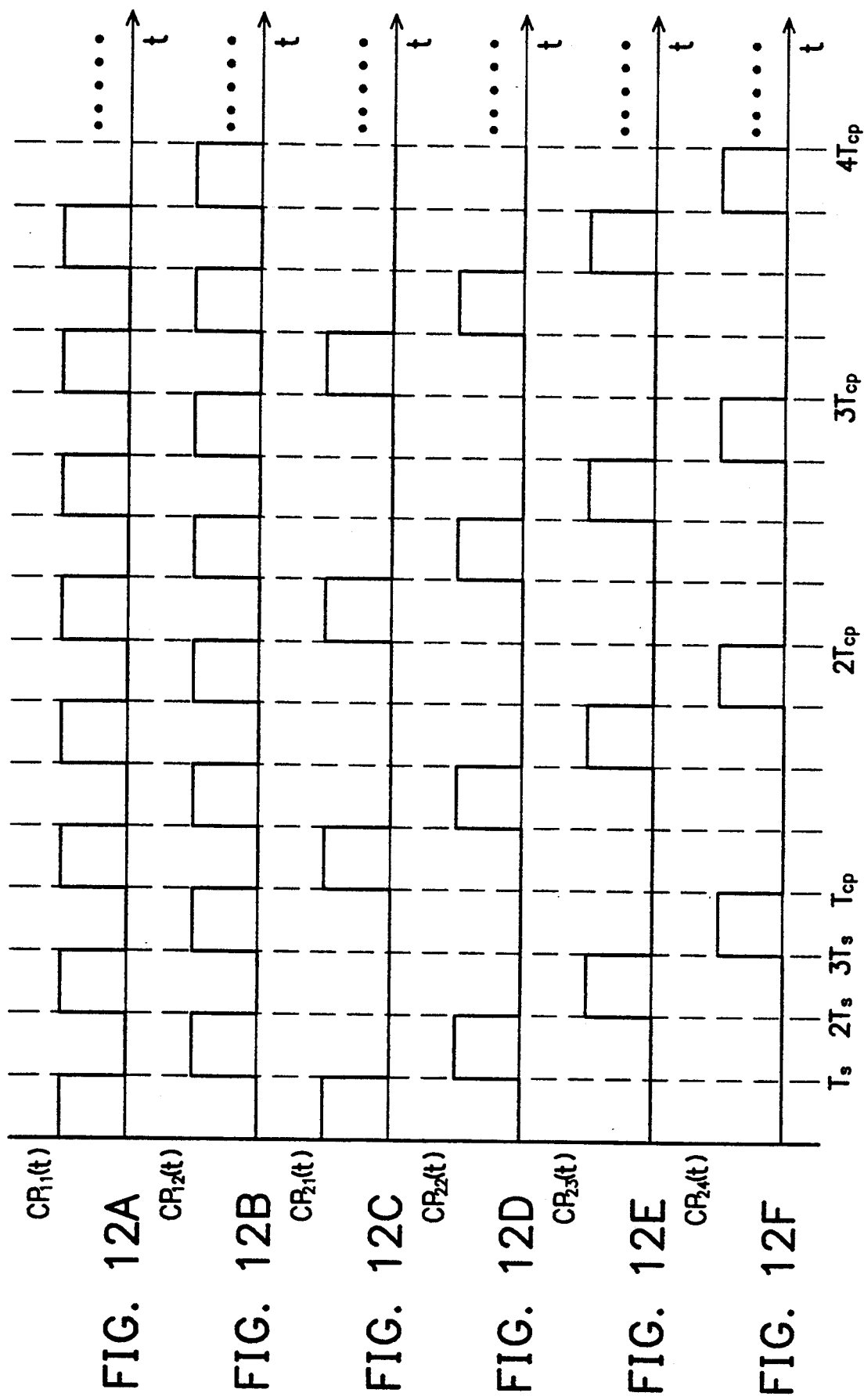

ns. Inform. Theory
CODE-DIVISION-MULTIPLE-ACCESS-SYSTEM BASED ON M-ARY PULSE-POSITION MODULATED DIRECT-SEQUENCE

BACKGROUND OF THE INVENTION

1. Field of the Invention

The present invention relates in general to a method of data transmission and reception, and more specifically, to a method of data transmission and reception using code-division-multiple-access (CDMA) technique.

2. Description of Prior Art

The spread-spectrum technique is a technique developed since about the mid-1950's. A detailed description of the conventional spread-spectrum systems can be found in a tutorial entitled "Theory of Spread Spectrum Communications—A Tutorial" authored by Raymond L. Pickholtz et al. and published on IEEE Trans. Commun., Vol. COM-30, pp. 855-884, May 1982.

The conventional BPSK (Binary-Phase-Shift-Keying) direct sequence spread spectrum communication system is shown in FIG. 1A-1B. A multiple access communication system that employs spread spectrum technique is technically termed as a code division multiple access (CDMA) system. The configuration of a basic CDMA system is shown in FIG. 2. A more detail description of the conventional BPSK-DS-SS (or BPSK-DS-CDMA) system of FIG. 1 will be given in the paragraphs under the header "Performance Evaluations."

The CDMA technique was developed mainly for capacity reasons. Ever since the analog cellular system started to face its capacity limitation in 1987, research efforts have been conducted on improving the capacity of digital cellular systems. In digital systems, there are three basic multiple access schemes: frequency division multiple access (FDMA), time division multiple access (TDMA), and code division multiple access (CDMA). In theory, it does not matter whether the channel is divided into frequency bands, time slots, or codes; the capacities provided from these three multiple access schemes are the same. However, in cellular systems, we might find that one scheme may be better than the other.

A list of technical references pertinent to the subject matter of the present invention is given below:

[1] "Overview of Cellular CDMA", by William C. Y. Lee, IEEE Trans. Veh. Tech., Vol. 40, No. 2, pp. 291-302, May 1991.

[2] "On the Capacity of a Cellular CDMA System", by A. J. Viterbi, L. A. Weaver, and C. E. Wheatley III, IEEE Trans. Veh. Tech., Vol. 40, No. 2, pp. 303-312, May 1991.

[3] "A Statistical Analysis of On-off Patterns in 16 Conversations", by P. T. Brady, Bell Syst. Tech. J., Vol. 47, pp. 73-91, Jan. 1968.

[4] "Coherent Spread Spectrum Systems", by J. K. Holmes, John Wiley and Sons, New York, pp. 388-389, 1982.

[5] "Error Probability of Asynchronous Spread Spectrum Multiple Access Communications Systems", by K. Yao, IEEE Trans. Commum. Vol. COM-25, pp. 803-807, 1977.

[6] "Direct-Sequence Spread Spectrum Multiple-Access Communications with Random Signature Sequences: Large Deviations Analysis", by J. S. Sadowsky and R. K. Bahr, IEEE Trans. Inform. Theory Vol. 37, No. 3, pp. 514-527, May 1991.

[7] "Digital Communications and Spread Spectrum Systems", by R. E. Ziemer and R. L. Peterson, Macmillan, New York, Ch. 11, 1985.

[8] "Spread Spectrum Multiple Access Communications, Multi-User communication Systems", by M. B. Pursley, edited by G. Longo, Springer-Verlag, N.Y. pp. 139-199, 1981.

[9] "Performance Evaluation for Phase-Coded Spread-Spectrum Multiple-Access Communication—Part II: Code Sequence Analysis", by M. B. Pursley and D. V. Sarwate, IEEE Trans. Commun., Vol. Com-25, No. 8, pp. 800-803, August 1977.

Remarkable results have been derived in the pertinent reference [2], "On the Capacity of a Cellular CDMA System" by A. J. Viterbi et al. This technical paper shows that the net improvement in the capacity of CDMA systems is four to six times better than that of a digital TDMA or FDMA system, and nearly 20 times better than that of current analog FM/FDMA system. Therefore, the CDMA scheme may become a major system in future communication systems.

The reason for the improvement in the multiple access capacity of the CDMA system mentioned above is that the capacity of the CDMA system is inversely proportional to cross-correlation noise, which is influenced or can be reduced by: (1) voice activity with a duty factor of approximately ⅜; and (2) spatial isolation through use of multi-beamed or multi-sectored antennas. Therefore if we can find another factor which can reduce the cross-correlation noise, the multiple access capacity will increase correspondingly.

SUMMARY OF THE INVENTION

A primary object of the present invention is to provide a CDMA system by which the multiple access capacity is increased and the transmitting energy is decreased compared to the conventional BPSK-DS-CDMA system.

In accordance with the above objects, a code division multiple access (CDMA) system based on M-ary pulse position modulated direct sequence is provided. This system is called a BPSK-MPP-DS-CDMA (Binary-Phase-Shift-Keyed M-ary Pulse-Position-Modulated-Direct-Sequence) system. The data source in this system sends out a sequence of data bits with bit duration T. According to the present invention the system first converts the serial binary data stream into M parallel bit sequences. These M parallel bit sequences can thus be considered as a sequence of M-bit vectors with each bit having a duration of MT. A number $N_{cp}$, which is the period of a pseudorandom process $PN_p(t)$, is selected to divide each MT duration into $N_{cp}$ intervals with every interval having a duration $T_{cp}$, where $T_{cp}=MT/N_{cp}$. Each interval $T_{cp}$ is further divided into $2^{M-1}$ pulse positions, each pulse position having a duration $T_s$, $T_s=T_{cp}/2^{M-1}$. Each M-bit vector is converted into a corresponding block of $N_{cp}$ duty pulses in every interval MT, with each duty pulse set in accordance with a predetermined mapping table to appear in one of the $2^{M-1}$ pulse positions and with a certain polarity. This duty pulse train is then modulated with a sample $PN_p{}^i(t)$ of the pseudorandom process $PN_p(t)$. The modulated signal is modulated further by a carrier signal and then is transmitted over the channel of the communication system.

In the receiving end of the communication system, the received signal is demodulated synchronously by the carrier signal and the pseudorandom sequence signal $PN_p{}^i(t)$ to recover each duty pulse block during a duration MT. The pulse position and the polarity of the $N_{cp}$ pulses in each received duty pulse block are determined and are used to find the bit pattern represented by each received duty pulse block by using the predetermined mapping table in a reverse manner. In this way, a vector of M parallel data bits are recovered during this duration MT.

Under the condition that the energy used for one decision (this energy will be defined in the paragraphs under the header "Performance Evaluations") in all concerned systems is equal, the BPSK-MPP-DS-CDMA system according to the present invention has three improved characteristics over the conventional BPSK-DS-CDMA system. These improved characteristics include reduction of cross-correlation noise, an increase in multiple access capacity, and reduction of transmitting energy.

The cross-correlation noise is reduced by a factor of 4 if the system is based on M=2; 12 if the system is based on M=3, 32 if the system is based on M=4, and 80 if the system is based on M=5. If the multiple access capacity is not limited by the period $N_{cp}$ of the pseudorandom sequence signal $PN_p{}^i(t)$, then under the same bandwidth and same bit error rate constraints, the multiple access capacity is improved by a factor at least of 2 if the system is based on M=2; 5.34 if the system is based on M=3; 13.28 if the system is based on M=4; and 26.4 if the system is based on M=5. Conversely, if the multiple access capacity is limited by $N_{cp}$, that is after the number of users attain $N_{cp}$, the extra reduction in cross-correlation noise can reduce the bit error rate of the system.

For a general M-ary system, the tramsmitting energy is only 1/M of that in the conventional system, i.e., (M−1)/M of the transmitting energy is saved. The proofs of these results will be given in the performance evaluation of the prefered embodiment section.

BRIEF DESCRIPTION OF THE DRAWINGS

The present invention can be more fully understood by reading the subsequent detailed description of the preferred embodiments thereof with references made to the accompanying drawings, wherein.

For the Conventional BPSK-DS-SS System.

Figure 3A:
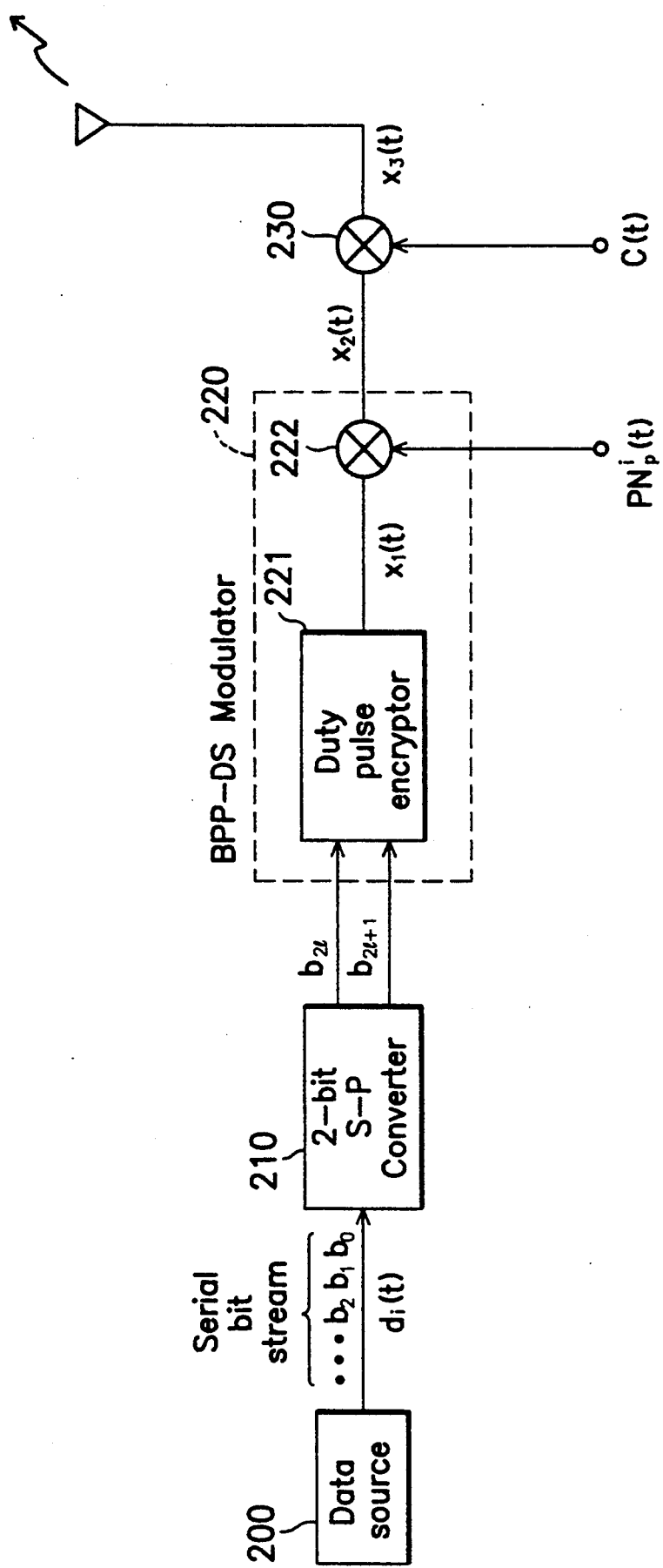
Figure 3B:
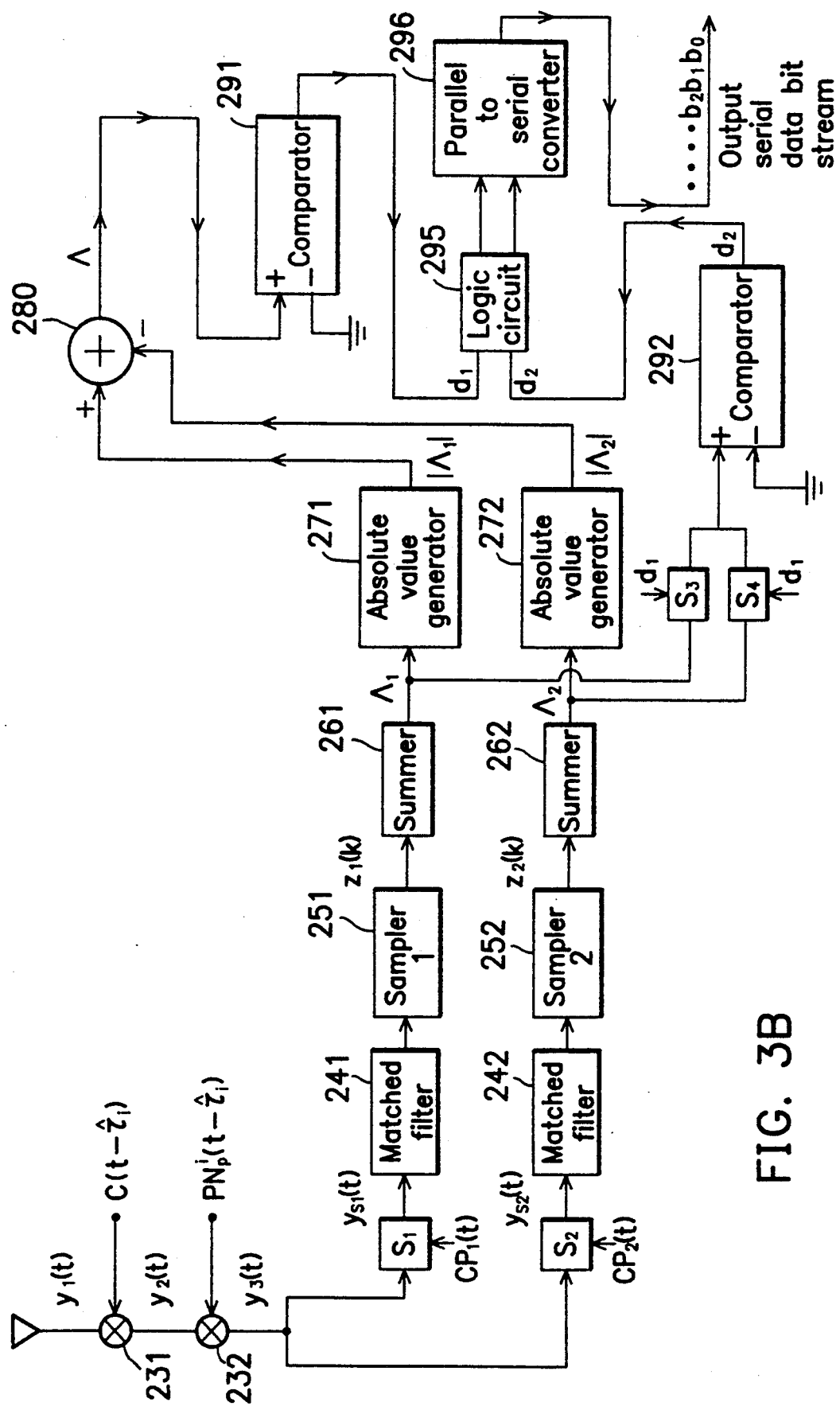
Figures 6A, 6B:
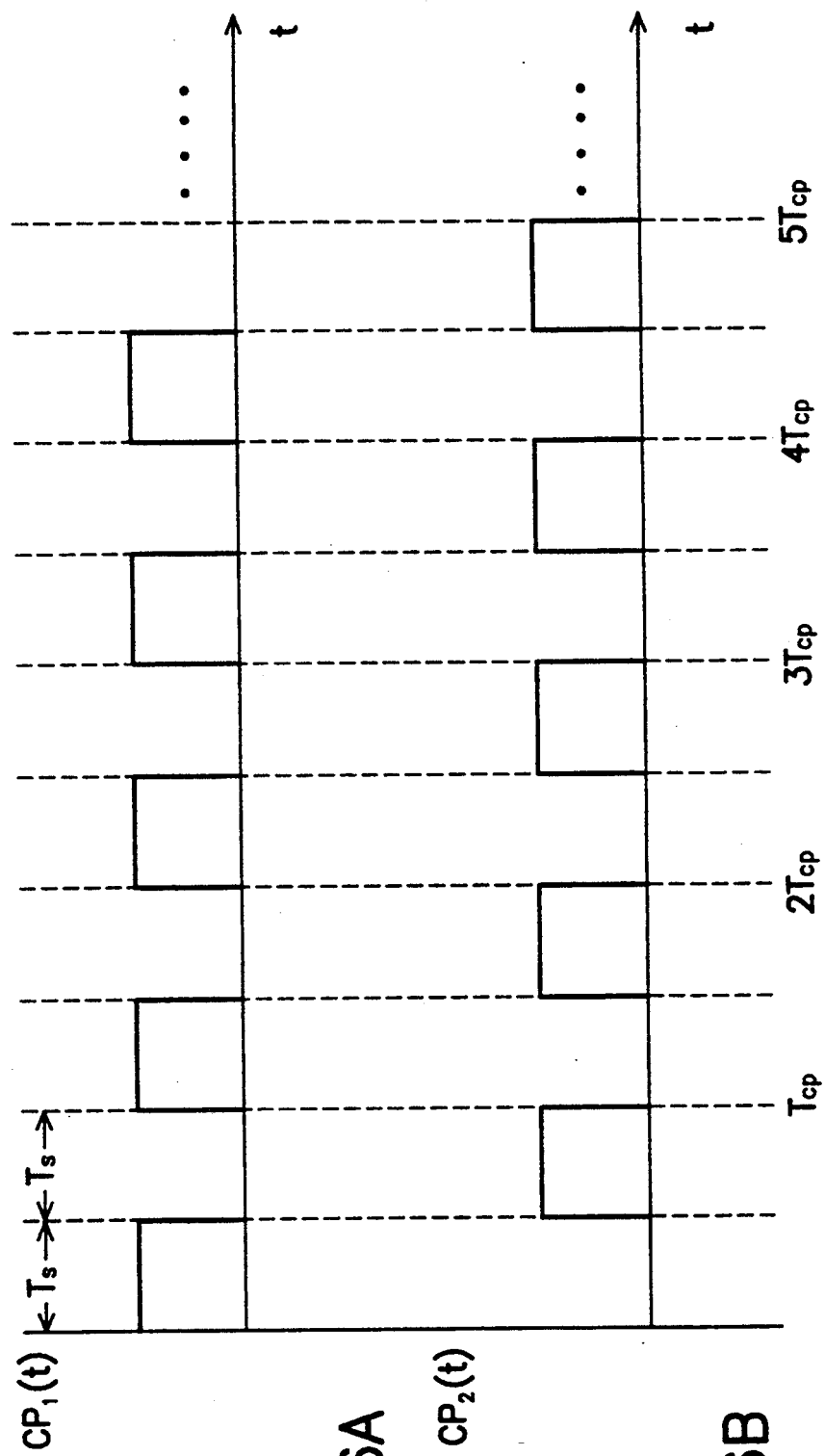
Figure 7A:
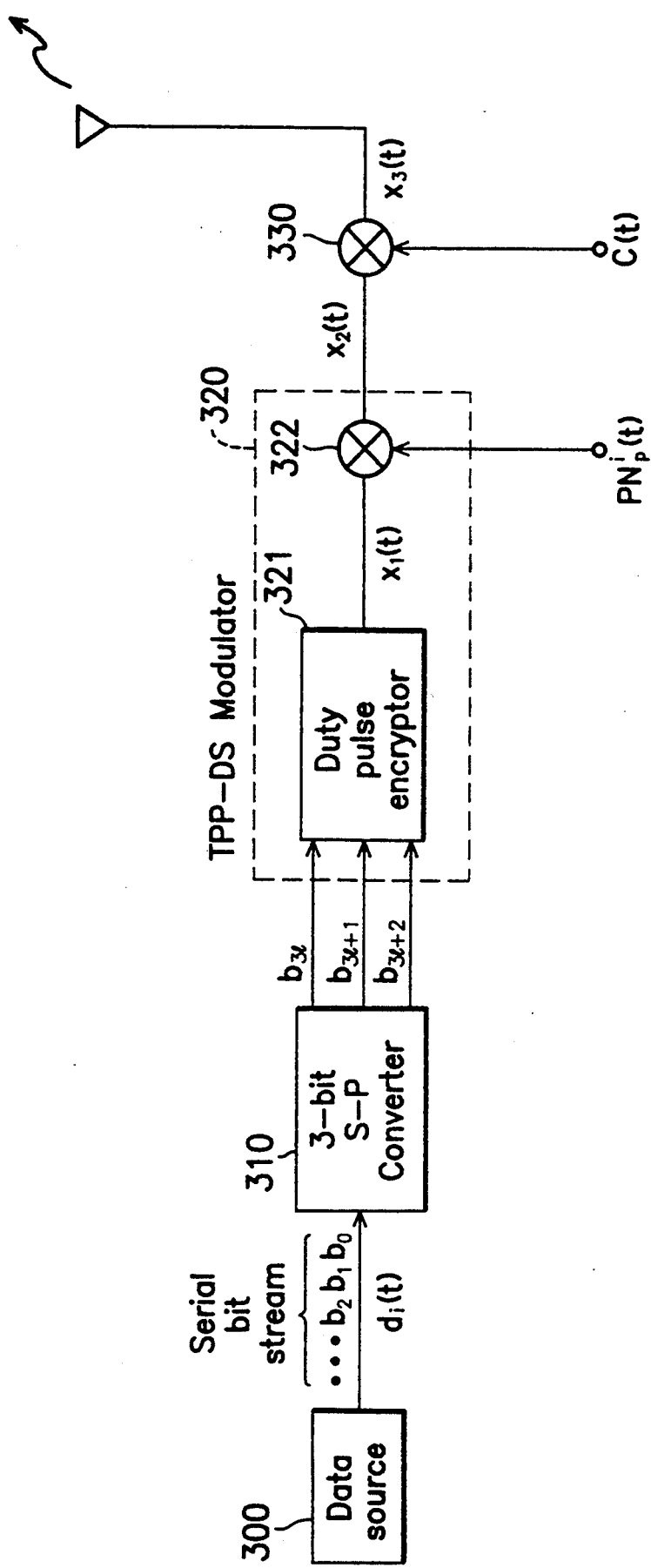
Figure 7B:
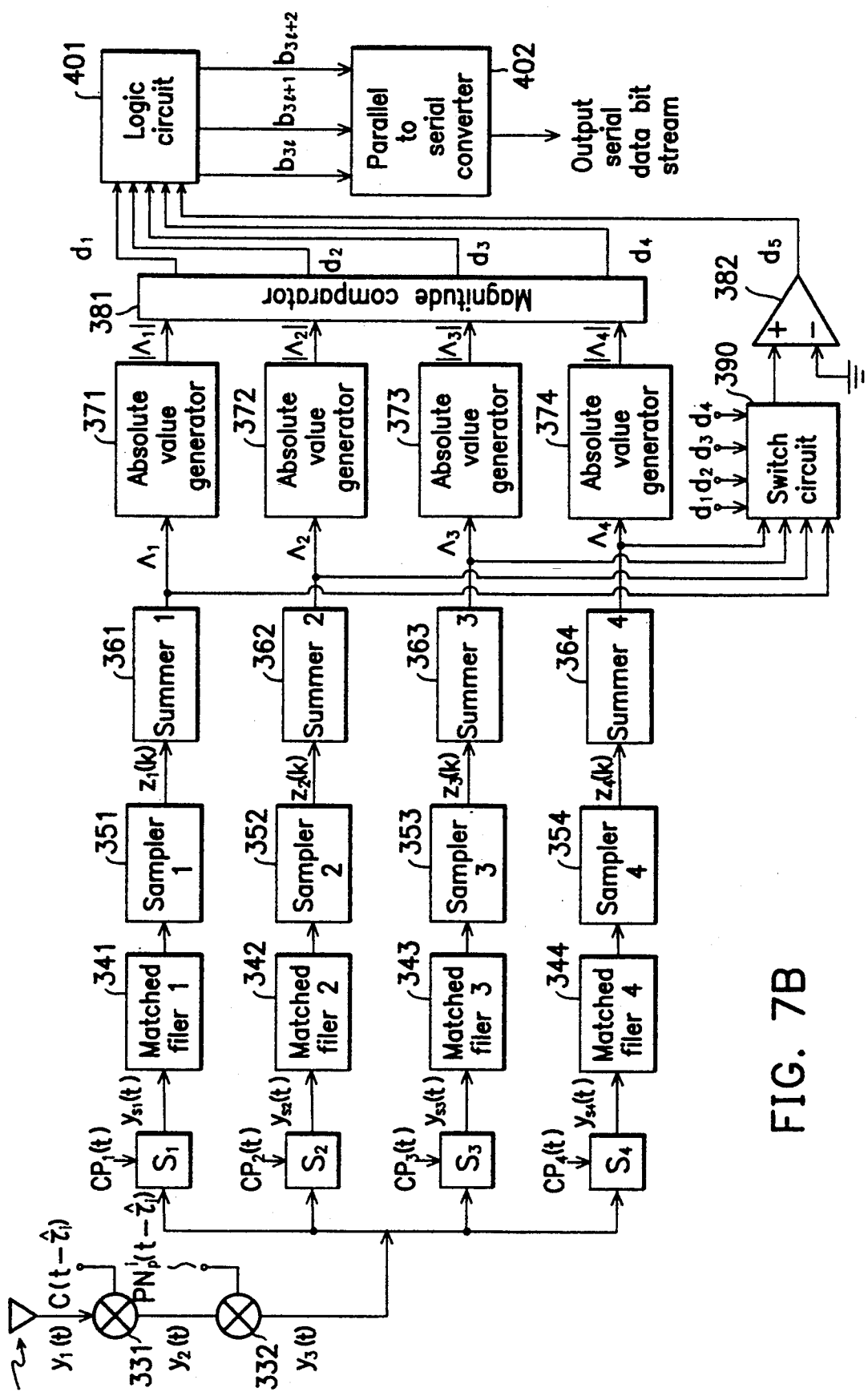
Figures 9A, 9B:
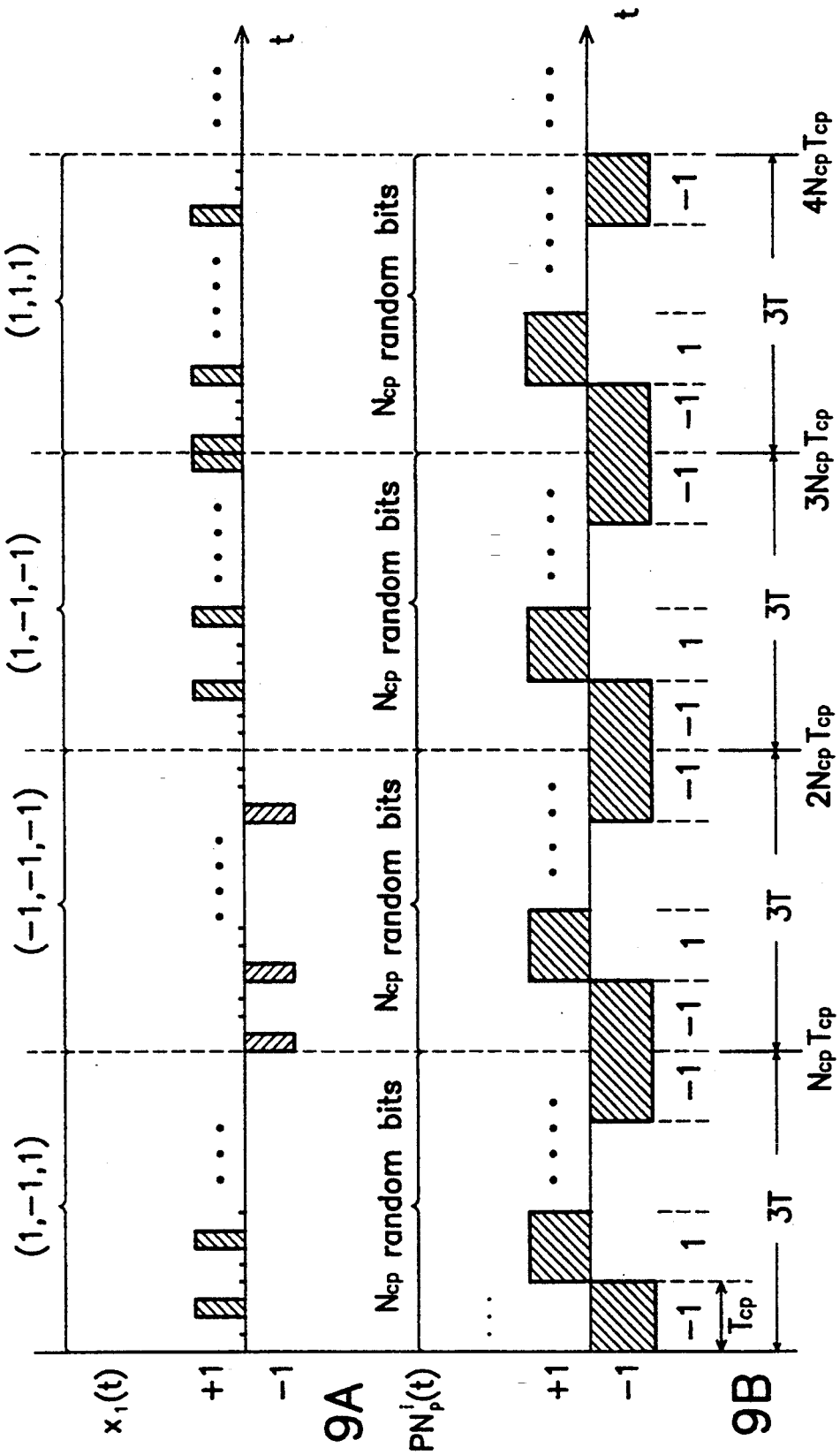
Figure 11:
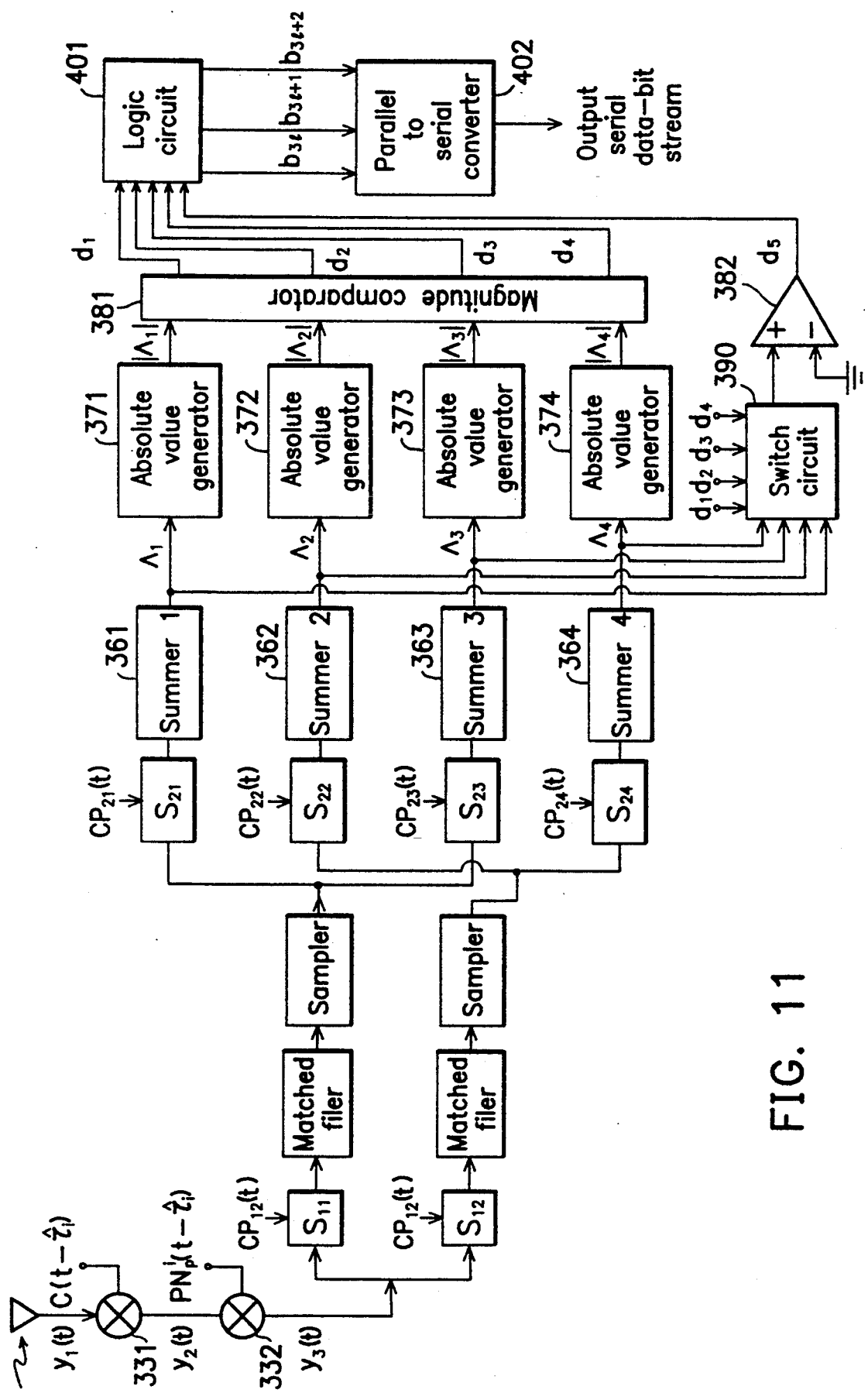
Figure 13A:
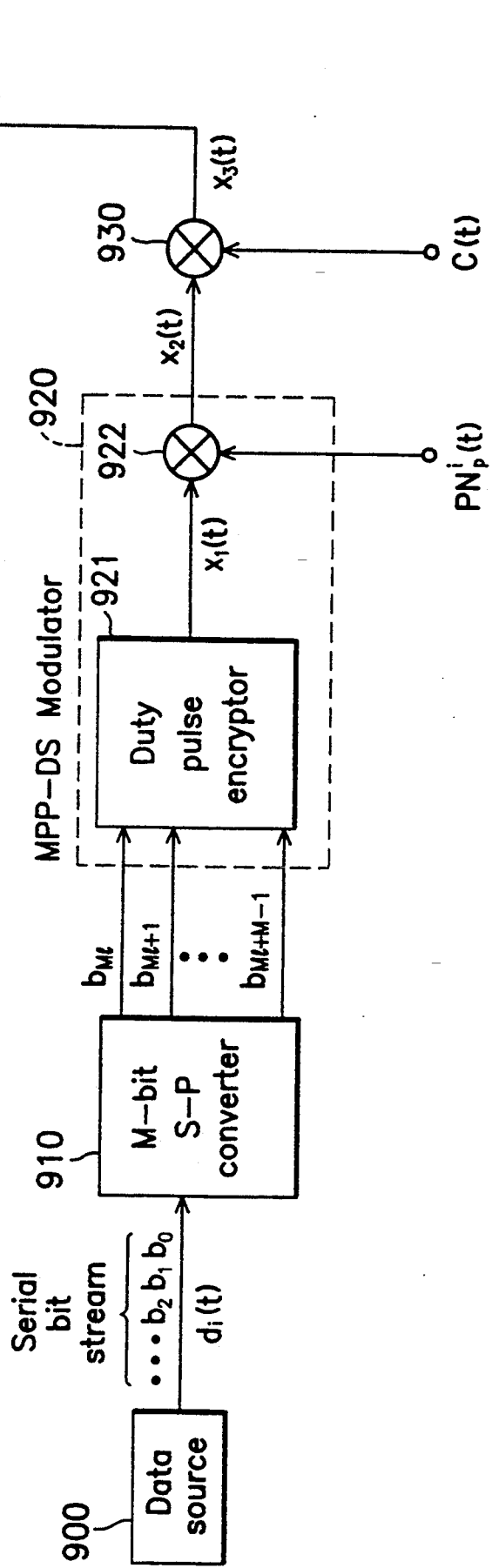
Figure 13B:
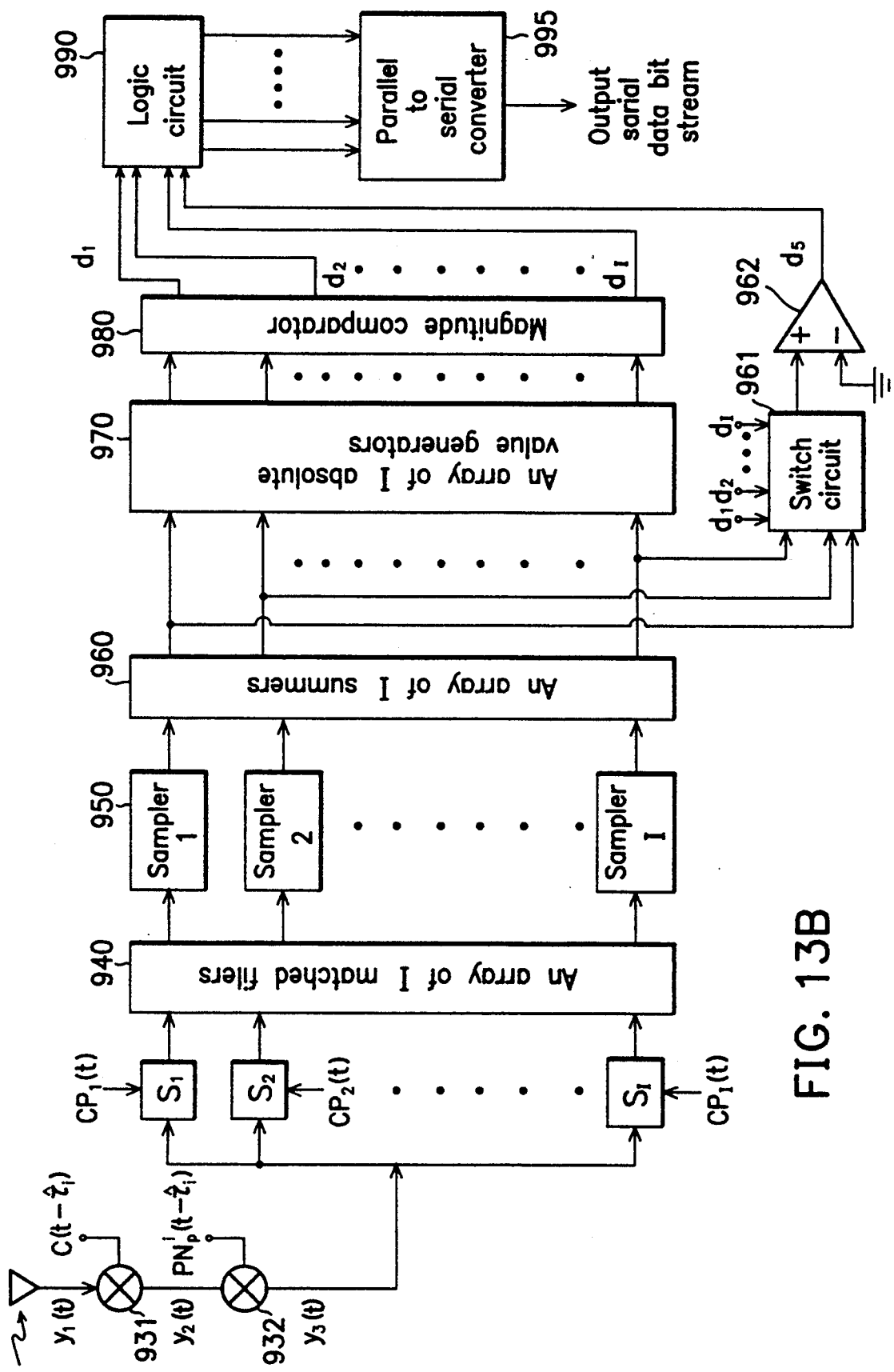
Figure 14A:
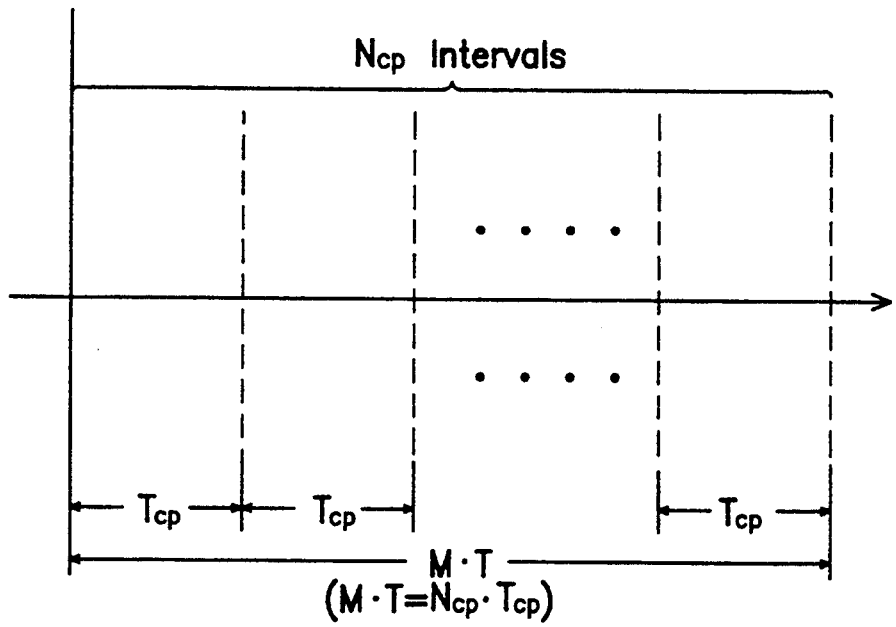
Figure 14B:
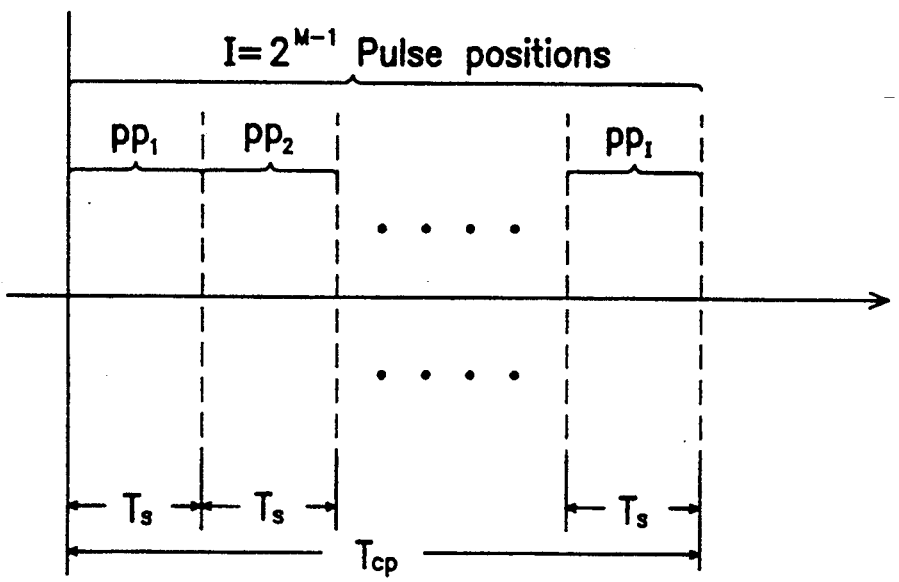
Figure 15:
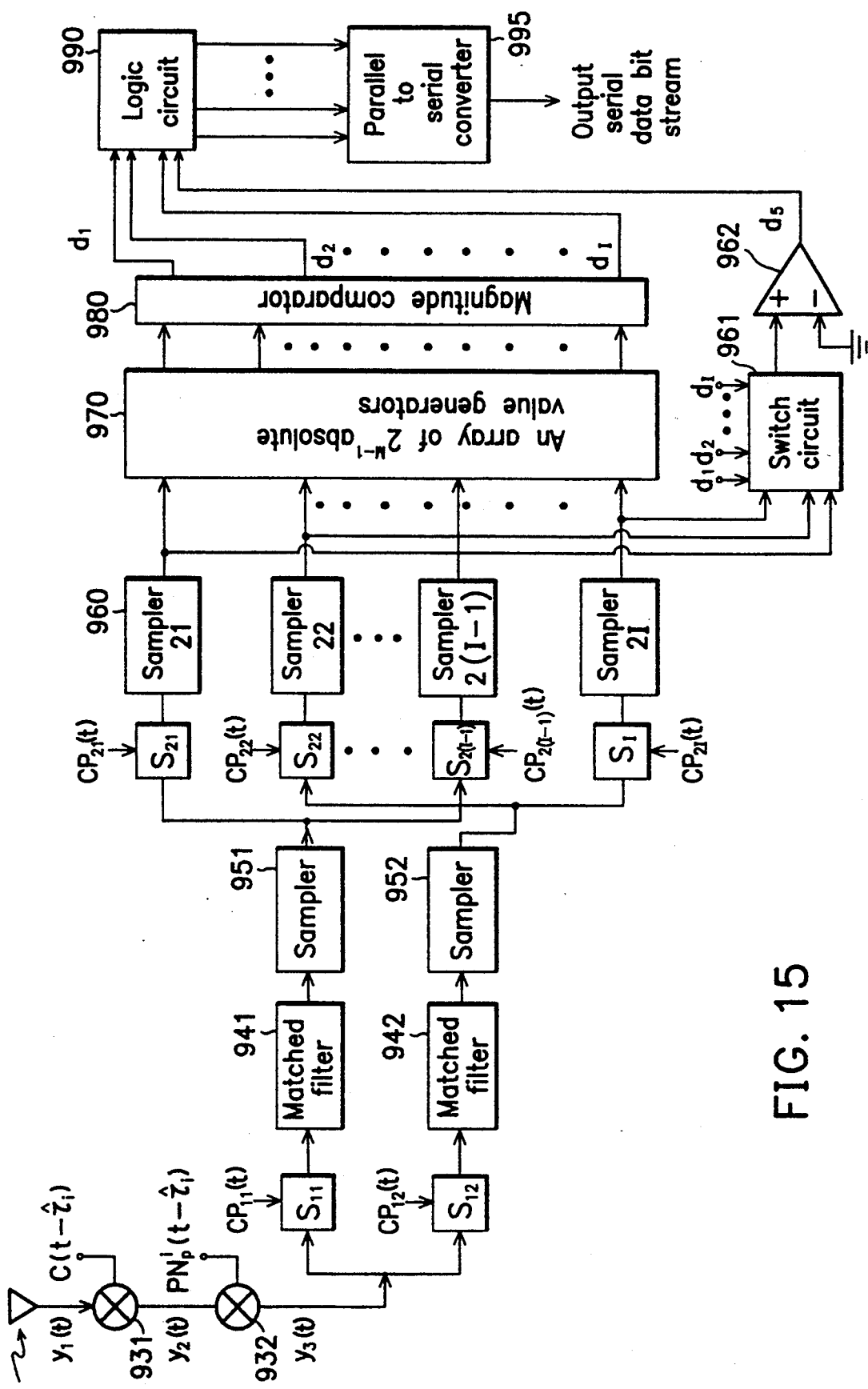
Figure 16A:
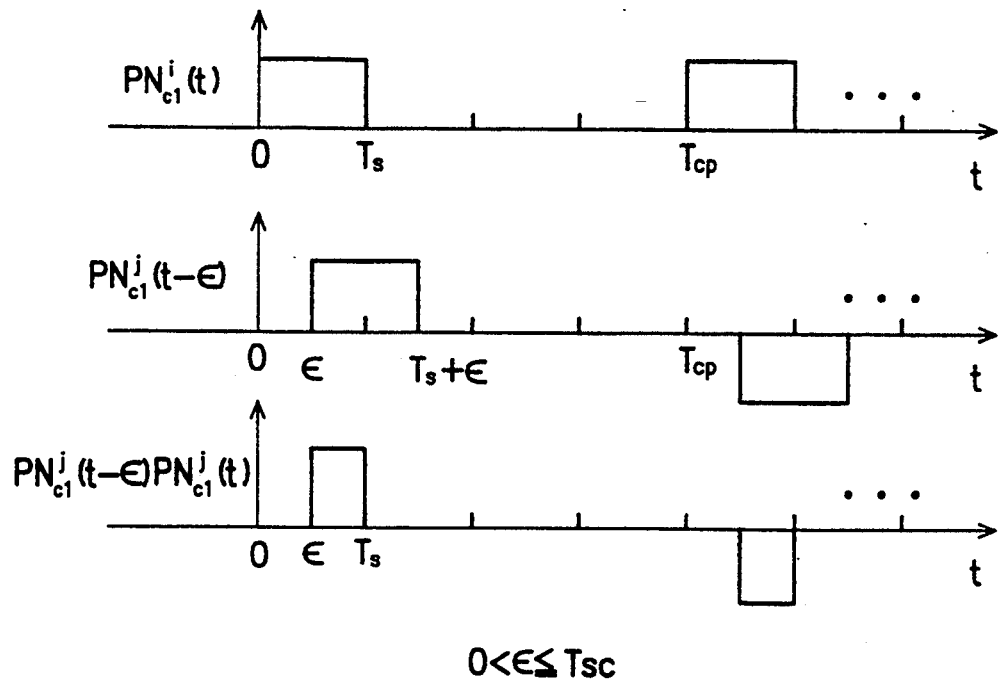
Figure 16B:
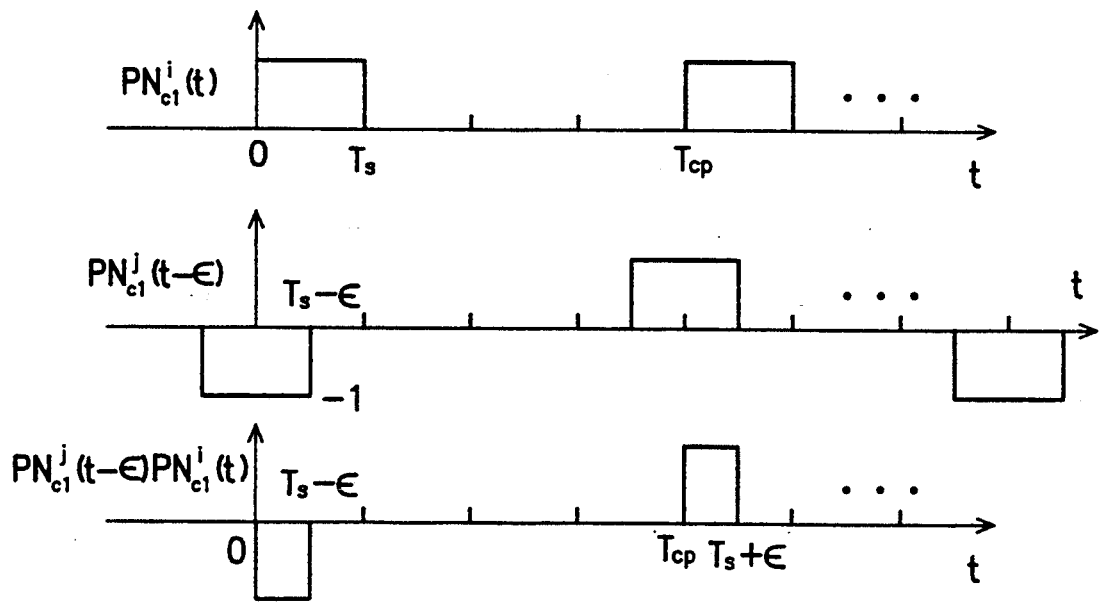

For the BPSK-BPP-DS-CDMA System:

FIG. 3A shows the block diagram of a BPSK-BPP-DS-CDMA transmitter devised in accordance with the present invention;

FIG. 3B shows the block diagram of a BPSK-BPP-DS-CDMA receiver devised in accordance with the present invention;

FIGS. 4A–4D are four waveform patterns, showing the encrypted duty pulse trains generated respectively in response to the bit patterns of four different 2-bit vectors;

FIG. 5A shows the waveform of an example of a train of encrypted duty pulses;

FIG. 5B shows an example of a pseudorandom sequence signal used to modulate the pulse train of FIG. 5A;

FIGS. 6A–6B show the waveforms of two control pulse trains used respectively to control the ON/OFF mode of a pair of switches in the receiver of FIG. 3B;

For the BPSK-TPP-DS-CDMA System:

FIG. 7A shows the block diagram of a BPSK-TPP-DS-CDMA transmitter devised in accordance with the present invention;

FIG. 7B shows the block diagram of a BPSK-TPP-DS-CDMA receiver devised in accordance with the present invention;

FIGS. 8A–8H are eight waveform diagrams, showing the encrypted duty pulse trains generated respectively in response to the bit patterns of eight different 3-bit vectors;

FIG. 9A shows the waveform of an example of a train of encrypted duty pulses;

FIG. 9B shows an example of a pseudorandom sequence signal used to modulate the pulse train of FIG. 9A;

FIGS. 10A–10D show the timing diagrams of four control pulse trains used respectively to control the ON/OFF mode of an array of four switches in the receiver of FIG. 7B;

FIG. 11 shows the block diagram of a modified BPSK-TPP-DS-CDMA receiver devised in accordance with the present invention;

FIGS. 12A–12F show the waveforms of six control pulse trains used respectively to control the ON/OFF mode of the switches $S_{11}$, $S_{12}$, $S_{21}$, $S_{22}$, $S_{23}$, and $S_{24}$ in the receiver of FIG. 11;

For the BPSK-MPP-DS-CDMA System:

FIG. 13A shows the block diagram of a generalized BPSK-MPP-DS-CDMA transmitter devised in accordance with the present invention;

FIG. 13B shows the block diagram of a generalized BPSK-MPP-DS-CDMA receiver devised in accordance with the present invention; and FIGS. 14A–14B are diagrams used to depict how pulse positions are formed in a generalized M-ary system;

FIG. 15 shows the block diagram of a modified BPSK-MPP-DS-CDMA receiver devised in accordance with the present invention;

For Performance Evaluations:

FIGS. 16A–16B show a set of typical cross-correlated waveforms of $PN_{c}{}^j(t-\epsilon)PN_{c1}{}^i(t)$ for M=3.

DETAILED DESCRIPTION OF THE PREFERRED EMBODIMENTS

The present invention relates to a spread spectrum transmission and reception system based on an M-ary pulse position modulated direct sequence. In the following detailed descriptions, examples will be given for the cases of M=2 and M=3. Finally, a generalized BPSK-MPP-DS-CDMA system is described.

EXAMPLE 1

A BPSK-BPP-DS-CDMA System (M=2)

Referring to FIGS. 3A–3B, there show a BPSK-BPP-DS-CDMA (binary-phase shift-keyed binary-pulse-position modulated direct-sequence code-division-multiple-access) system devised in accordance with the present invention. The transmitter portion of the system is shown in FIG. 3A and the receiver portion of the system is shown in FIG. 3B.

The transmitter portion of the system, which is used to transmit binary signals from a data source 200 to a communication channel, includes a serial-to-parallel converter 210, a BPP-DS modulator 220, and a carrier modulator 230. The BPP-DS modulator 220 consists of a duty pulse encryptor 221 and a pulse modulator 222.

In practice, a data bit "1" is transformed into a positive square pulse with a duration of T and a data bit "−1" is transformed into a negative square pulse also with a duration of T at the output of the data source 200. When a data bit stream BS=($b_0$, $b_1$, $b_2$, ..., $b_{n-1}$...) is sent out from the data source 200 with a bit duration of T and is to be transmitted over the communication channel, the data bit stream BS is first converted by the serial-to-parallel converter 210 into two parallel bit streams $BS_1$ and $BS_2$, $BS_1$=($b_0$, $b_2$, $b_4$, ..., $b_{2l}$, ...) and $BS_2$=($b_1$, $b_3$, $b_5$, ... $b_{2l+1}$, ...). However, the duration of each bit in $BS_1$ and $BS_2$ is 2T. Consequently, the 2-bit serial-to-parallel converter 210 sends out a sequence of 2-bit vectors ($b_{2l}$, $b_{2l+1}$), l =0,1,2,,..., to the BPP-DS modulator 220. Each thus formed 2-bit vector has a bit pattern which may be one of the four possible bit patterns as listed in the following Table-A1:

TABLE A1

| ($b_{2l}$, $b_{2l+1}$) |
|---|
| (1, 1) |
| (1, −1) |
| (−1, 1) |
| (−1, −1) |

In the BPP-DS modulator 220, each 2-bit vector is processed firstly by the duty-pulse-encryptor 221 and then modulated in the pulse modulator 222 with a pseudorandom sequence signal $PN_p^i(t)$. In the present invention, a number $N_{cp}$, the period of the pseudorandom sequence signal $PN_p^i(t)$, is used to divide the bit duration 2T into $N_{cp}$ equal intervals with each interval thus having a duration of $2T/N_{cp}$. The duration $2T/N_{cp}$ is called the chip $T_{cp}$ of the pseudorandom sequence signal $PN_p^i(t)$. Each chip $T_{cp}$ is divided into two pulse positions (in general the number of pulse positions divided is equal to $2^{M-1}$ for M-ary system). The duration of each pulse position is $T_s$, $T_s=T_{cp}/2$. The two pulse positions within each $T_{cp}$ are defined as "$PP_1$" and "$PP_2$", respectively.

The duty pulse encryptor 221 includes a built-in one-to-one mapping table defining the generating of a duty pulse train in response to the bit pattern of a 2-bit vector ($b_{2l}$,$b_{2l+1}$). The preferred embodiment of the present invention incorporates a mapping table having the following mapping relationships:

(a) if the input 2-bit vector is (1, 1), the duty pulse encryptor 221 sends out a package of $N_{cp}$ consecutive positive square pulses during the interval 2T with each square pulse appearing at the pulse position defined as "$PP_1$";

(b) if the input 2-bit vector is (1,−1), the duty pulse encryptor 221 sends out a package of $N_{cp}$ consecutive positive square pulses during the interval 2T with each square pulse appearing at the pulse position defined as "$PP_2$";

(c) if the input 2-bit vector is (−1, 1), the duty pulse encryptor 221 sends out a package of $N_{cp}$ consecutive negative square pulses during the interval 2T with each square pulse appearing at the pulse position defined as "$PP_2$"; and (d) if the input 2-bit vector is (−1,−1), the duty pulse encryptor 221 sends out a package of $N_{cp}$ consecutive negative square pulses during the period 2T with each square pulse appearing at the pulse position defined as "$PP_1$."

The foregoing mapping relationships are summarized in the following Table-A2. They can also be schematically visualized respectively from the diagrams of FIGS. 4A–4D.

TABLE A2

| Bit Pattern | encrypted Duty Pulse | |
|---|---|---|
| ($b_{2l}$, $b_{2l+1}$) | Pulse Position | Polarity |
| (1, 1) | $PP_1$ | +1 |
| (1, −1) | $PP_2$ | +1 |
| (−1, 1) | $PP_2$ | −1 |
| (−1, −1) | $PP_1$ | −1 |

The square pulse in each chip $T_{cp}$ is termed as a "duty pulse." Only one duty pulse will be present in each chip $T_{cp}$. For example, if the leading eight bits in the bit stream BS are (1, −1, −1, −1, −1, 1, 1, 1), then the duty pulse encryptor 221 will send out a corresponding signal $x_1(t)$ as illustrated in FIG. 5A. The thus formed signal $x_1(t)$ is subsequently modulated by the pseudorandom sequence signal $PN_p^i(t)$. The timing relationship between $x_1(t)$ and $PN_p^i(t)$ can be seen from FIGS. 5A–5B. The pseudorandom sequence signal $PN_p^i(t)$ contains $N_{cp}$ consecutive pseudorandom bits with each bit having a duration of $T_{cp}$. The signal $x_2(t)$ at the output of pulse modulator 222 is $$x_2(t)=x_1(t)PN_p^i(t), \quad (1)$$

which is subsequently modulated at the carrier modulator 230 by a sinusoidal signal $C(t)=\sqrt{2P}\sin(\omega_0 t)$ to obtain a modulated signal $x_3(t)$ and thereby transmitted through the communication channel to its destination.

Referring back to FIG. 3B, the transmitted signal is picked up by the receiver portion of the system located at the receiving end of the channel. For noise free situation, the received signal is $y_1(t)=Ax_3(t-\tau_i)$, where "A" is the amplitude of $y_1(t)$, and $\tau_i$ is the transmission delay of $x_3(t)$. The signal $y_1(t)$ is demodulated by multiplying it with a sinusoidal signal $C(t-\hat{\tau}_i)=\sqrt{2}\sin\omega_0(t-\hat{\tau}_i)$, where $\hat{\tau}_i$ is the estimate of $\tau_i$. Since the purpose of this description is only to demonstrate the operation of the system, A=1 and $\hat{\tau}_i=\tau_i=0$ can be assumed without the loss of generality. The demodulated signal $y_2(t)$ is then multiplied by a local pseudorandom sequence signal $PN_p^i(t-\tau_i)$, which should be in synchronization with the received $PN_p^i(t-\hat{\tau}_i)$. The waveform of the signal $y_3(t)$ would be identical to $x_1(t)$ in FIG. 3A if no noise interference were present in the channel. However, no noise interference is only an ideal condition and in practice the signal $y_3(t)$ may be expressed as:

$$y_3(t)=x_1(t)+I(t)+n(t), \quad (2)$$

where I(t) is the cross-correlation noise, and n(t) is the white noise.

A pair of switches $S_1$ and $S_2$, with ON/OFF mode thereof being controlled respectively by a first pulse train $CP_1(t)$ and a second pulse train $CP_2(t)$, are connected in parallel to the output of the pulse-demodulator 232. The waveforms of the two pulse trains $CP_1(t)$ and $CP_2(t)$ are shown in FIGS. 6A–6B. Each of the two pulse trains $CP_1(t)$ and $CP_2(t)$ is a periodic pulse train having pulse duration $T_s$ and period exactly equal to $T_{cp}$, where $T_s = T_{cp}/2$. The appearance of one square pulse in the pulse train $CP_1(t)$ will actuate the switch $S_1$ to be turned ON; and the appearing of one square pulse in the pulse train $CP_2(t)$ will actuate the switch $S_2$ to be turned ON. A pair of matched filters 241 and 242 (which are integrate-and-dump circuits for the present invention) are connected respectively to the switches $S_1$ and $S_2$ so that the signals passing through the switches $S_1$ and $S_2$, denoted by $y_{s1}(t)$ and $y_{s2}(t)$, are processed by the matched filters 241, 242 and sampled by a pair of samplers 251, 252. The outputs of the samplers 251, and 252 are denoted by $z_1(k)$ and $z_2(k)$, which are respectively given by:

$$z_1(k) = \frac{1}{T} \int_{(k-1)T_s}^{kT_s} y_{s1}(t)dt \quad (3)$$

$$z_2(k) = \frac{1}{T} \int_{kT_s}^{(k+1)T_s} y_{s2}(t)dt \quad (4)$$

where $k=1,2,\ldots,N_{cp}$

A pair of summers 261, 262 are used respectively to sum up the two outputs $z_1(k)$, $z_2(k)$ for $k=1,2,\ldots,N_{cp}$. The output signals of the two summers 261, 262 are referred to as "statistics" and are denoted by $\Lambda_l$, $l=1,2$, which are respectively given by:

$$\Lambda_1 = \sum_{k=1}^{N_{cp}} z_1(k) \quad (5)$$

$$\Lambda_2 = \sum_{k=1}^{N_{cp}} z_2(k) \quad (6)$$

Define a statistic $\Lambda = |\Lambda_1| - |\Lambda_2|$, where $|\Lambda_l|$ is the absolute value of $\Lambda_l$, $l=1,2$. Further define two decision bits $d_1$ and $d_2$, where $d_1$ is used to indicate the pulse position of each received duty pulse during each $T_{cp}$, and $d_2$ is used to indicate the polarities of duty pulse train.

The following Table-A3 can be used to determined the values of $d_1$ and $d_2$ in accordance with received duty pulse:

TABLE A3

| Received Duty Pulse | | Decision Bits |
|---|---|---|
| Pulse Position | Polarity | $(d_1, d_2)$ |
| $PP_1$ | +1 | (1, 1) |
| $PP_2$ | +1 | (−1, 1) |
| $PP_2$ | −1 | (−1, −1) |
| $PP_1$ | −1 | (1, −1) |

The decision bit $d_1$ can be determined by the following two criteria:

(1) if $\Lambda \geq 0$, then $d_1 = 1$, and
(2) if $\Lambda < 0$, then $d_1 = -1$.

These two criteria can be implemented by a comparator 291, which compares the magnitude of the signal $\Lambda$ with a zero reference voltage. Accordingly, if $\Lambda \geq 0$, the comparator 291 generates a logic high voltage representing a bit "1"; and if $\Lambda < 0$, the comparator 291 generates a logic low voltage representing a bit "−1".

The subsequent step is to determine the decision bit $d_2$, i.e., the polarity of the duty pulse train within 2T.

This can be implemented by the arrangement of a second comparator 292 connected via two switches $S_3$ and $S_4$ respectively to the output of the two summers 261, 262. The decision bit $d_1$, which has been already determined at this time, is used to control the ON/OFF of the two switches $S_3$, $S_4$ in such a way that if $d_1 = 1$, the switch $S_3$ is triggered ON and the switch $S_4$ is triggered OFF, thereby causing only the signal $\Lambda_1$ to be passed to the second comparator 292; and if $d_1 = -1$, the switch $S_3$ is triggered OFF and the switch $S_4$ is triggered ON, thereby causing only the signal $\Lambda_2$ to be passed to the second comparator 292.

The second comparator 292 compares the input signal with a zero reference voltage. If the magnitude of the input signal is positive, an output bit "1" is generated; and if the magnitude of the input signal is negative, an output bit "−1" is generated. The output bit of the second comparator 292 is taken as the decision bit $d_2$.

Based on the two decision bits $(d_1, d_2)$, the bit pattern represented by the received $N_{cp}$ duty pulses, denoted here in the receiver portion as $(\hat{b}_{2l}, \hat{b}_{l+1})$, can be determined. In accordance with the foregoing two predefined Table-A2 and Table-A3, a table listing logic relationships between $(\hat{b}_{2l}, \hat{b}_{2l+1})$ and $(d_1, d_2)$ can be obtained as Table-A4 shown below:

TABLE A4

| Decision Bits | Deciphered Bit Pattern |
|---|---|
| $(d_1, d_2)$ | $(\hat{b}_{2l}, \hat{b}_{2l+1})$ |
| (1, 1) | (1, 1) |
| (−1, 1) | (1, −1) |
| (−1, −1) | (−1, 1) |
| (1, −1) | (−1, −1) |

A logic circuit 295 is devised to implement the logic relationships of Table-A4, taking $(d_1, d_2)$ as the input and $(\hat{b}_{2l}, \hat{b}_{2l+1})$ as the output. The design of the logic circuit 295 is an obvious practice to those who skilled in the art of logic circuit designs, so that detailed circuit diagram thereof will not be illustrated and described.

Two data bits are thus obtained in parallel, which can be subsequently converted to serial bit stream by a parallel-to-serial converter 296. The receiving end thus can fetch from the output of the parallel-to-serial converter 296 a serial bit stream which represents the information sent by the data source 200.

EXAMPLE 2

A BPSK-TPP-DS-CDMA System (M=3)

Referring to FIGS. 7A–7B, there show a BPSK-TPP-DS-CDMA (TPP stands for "ternary pulse position") digital communication system. The transmitter portion of the system is shown in FIG. 7A, and the receiver portion of the system is shown in FIG. 7B. In the subsequent descriptions for the system of FIGS. 7A–7B, constituting components that are structurally and functionally the same as those used in the system of FIGS. 3A–3B will not be described in detail again.

In FIG. 7A, the data bit stream BS is converted by a 3-bit serial-to-parallel converter 310 into three parallel bit streams $BS_1$, $BS_2$, and $BS_3$, $$BS_1 = (b_0, b_3, b_6, \ldots, b_{3l}, \ldots) \quad (7)$$

$$BS_2 = (b_1, b_4, b_7, \ldots, b_{3l+1}, \ldots) \quad (8)$$

$$BS_3 = (b_2, b_5, b_8, \ldots, b_{3l+2}, \ldots) \quad (9)$$

However, the duration of each bit in $BS_1$, $BS_2$, and $BS_3$ is now changed to 3T. Consequently, the 3-bit serial-to-parallel converter 310 sends out a sequence of 3-bit vectors $(b_{3l}, b_{3l+1}, b_{3l+2})$, $l=0,1,2,\ldots$, to the TPP-DS modulator 320. Each thus formed 3-bit vector has a bit pattern which may be one of the eight possible bit patterns as listed in the following Table-B1:

TABLE B1

| $(b_{3l}, b_{3l+1}, b_{3l+2})$ |
|---|
| (1, 1, 1) |
| (1, 1, −1) |
| (1, −1, 1) |
| (1, −1, −1) |
| (−1, 1, 1) |
| (−1, 1, −1) |
| (−1, −1, 1) |
| (−1, −1, −1) |

Referring to FIGS. 8A–8H, a number $N_{cp}$, the period of the pseudorandom sequence signal $PN_p^i(t)$ shown in FIGS. 7A–7B, is selected to divide the duration 3T into $N_{cp}$ equal intervals. Each interval has a duration of $3T/N_{cp}$ which is referred to as the chip $T_{cp}$ of the pseudorandom sequence signal $PN_p^i(t)$. Each $T_{cp}$ is divided further by four (in general this number is equal to $2^{M-1}$) into four pulse positions with each pulse position having a duration of $T_s$, where $T_s = T_{cp}/4$. The four pulse positions are defined respectively as $PP_1, PP_2, PP_3$, and $PP_4$.

A mapping table, which defines the generating of a duty pulse train at the output of "Duty Pulse Encryptor 321" in response to the bit pattern of the 3-bit vector at the output of 3-bit S-P converter 310 is predetermined to have the following mapping relationships:

(a) if the 3-bit vector is (1, 1, 1), the duty pulse encryptor 321 is triggered to send out a package of $N_{cp}$ consecutive positive square pulses (these square pulses will be hereinafter referred to as "duty pulses") during the bit duration 3T, with each duty pulse appearing at the pulse position defined as $PP_1$;

(b) if the 3-bit vector is (1, 1, −1), the duty pulse encryptor 321 is triggered to send out a package of $N_{cp}$ consecutive positive duty pulses during the bit duration 3T, with each duty pulse appearing at the pulse position defined as $PP_2$;

(c) if the 3-bit vector is (1, −1, 1), the duty pulse encryptor 321 is triggered to send out a package of $N_{cp}$ consecutive positive duty pulses during the bit duration 3T, with each duty pulse appearing at the pulse position defined as $PP_3$;

(d) if the 3-bit vector is (1, −1, −1), the duty pulse encryptor 321 is triggered to send out a package of $N_{cp}$ consecutive positive duty pulses during the bit duration 3T, with each duty pulse appearing at the pulse position defined as $PP_4$;

(e) if the 3-bit vector is (−1, 1, 1), the duty pulse encryptor 321 is triggered to send out a package of $N_{cp}$ consecutive negative duty pulses during the bit duration 3T, with each duty pulse appearing at the pulse position defined as $PP_4$;

(f) if the 3-bit vector is (−1, 1, −1), the duty pulse encryptor 321 is triggered to send out a package of $N_{cp}$ consecutive negative duty pulses during the bit duration 3T, with each duty pulse appearing at the pulse position defined as $PP_3$;

(g) if the 3-bit vector is (−1, −1, 1), the duty pulse encryptor 321 is triggered to send out a package of $N_{cp}$ consecutive negative duty pulses during the bit duration 3T, with each duty pulse appearing at the pulse position defined as $PP_2$; and (h) if the 3-bit vector is (−1, −1, −1), the duty pulse encryptor 321 is triggered to send out a package of $N_{cp}$ consecutive negative duty pulses during the bit duration 3T, with each duty pulse appearing at the pulse position defined as $PP_1$.

The foregoing mapping relationships are summarized in the following Table-B2, or they can be schematically visualized respectively from the diagrams of FIGS. 8A–8H.

TABLE B2

| Bit Pattern | encrypted Duty Pulse | |
|---|---|---|
| $(b_{3l}, b_{3l+1}, b_{3l+2})$ | Pulse Position | Polarity |
| (1, 1, 1) | $PP_1$ | +1 |
| (1, 1, −1) | $PP_2$ | +1 |
| (1, −1, 1) | $PP_3$ | +1 |
| (1, −1, −1) | $PP_4$ | +1 |
| (−1, 1, 1) | $PP_4$ | −1 |
| (−1, 1, −1) | $PP_3$ | −1 |
| (−1, −1, 1) | $PP_2$ | −1 |
| (−1, −1, −1) | $PP_1$ | −1 |

Table-B2 only shows a preferred example of the mapping relationships. Each bit pattern can be in fact assigned by a one-to-one mapping relationship to any of the eight possible duty-pulse-train patterns within each duration 3T. Therefore, there can be arranged a total of 8!=40320 mapping tables so that it would be difficult for eavesdroppers to decipher the encrypted duty pulses.

If the leading twelve bits in the bit stream BS is 1−11, −1−1−1, 1−1−1, 111, then the duty pulse encryptor 321 will send out a corresponding signal $x_1(t)$ of duty pulse train as illustrated in FIG. 9A. The thus formed duty pulse train $x_1(t)$ is then modulated in the pulse modulator 322 with a pseudorandom sequence signal $PN_p^i(t)$ which has period $N_{cp}$ and chip $T_{cp}$. The timing relationship between $x_1(t)$ and $PN_p^i(t)$ can be seen from FIGS. 9A–9B. The resultant signal $x_2(t)$, $x_2(t)=x_1(t)PN_p^i(t)$, is then modulated further by a sinusoidal signal $C(t)=\sqrt{8P/3}\sin(\omega_0 t)$ and the modulated signal $x_3(t)$ is transmitted through the communication channel to its destination.

Referring back to FIG. 7B, the receiver of the system includes an array of four switches $S_1, S_2, S_3, S_4$, which are coupled respectively in subsequence with an array of four matched filters 341, 342, 343, 344, an array of four samplers 351, 352, 353, 354, and an array of four summers 361, 362, 363, 364. The ON/OFF modes of the four switches $S_1, S_2, S_3, S_4$ are respectively controlled by four control pulse sequences $CP_1(t), CP_2(t), CP_3(t), CP_4(t)$ having waveforms illustrated in FIGS. 10A–10D. The appearance of each square pulse in the four control sequences is used to trigger ON the associated switch such that:

during the duration of pulse position $PP_1$, only $S_1$=ON and $S_2=S_3=S_4$=OFF;

during the duration of pulse position $PP_2$, only $S_2$=ON and $S_1=S_3=S_4$=OFF;

during the duration of pulse position $PP_3$, only $S_3$=ON and $S_1=S_2=S_4$=OFF;

during the duration of pulse position $PP_4$, only $S_4$=ON and $S_1=S_2=S_3$=OFF.

The signals passing the switches $S_1, S_2, S_3$, or $S_4$, denoted respectively by $y_{s1}(t), y_{s2}(t), y_{s3}(t), y_{s4}(t)$, are processed by the matched filters 341, 342, 343, 344 in accordance with the following integration relationships:

$$z_1(k) = \frac{4}{3T} \int_{(k-1)T_s}^{kT_s} y_{s1}(t)dt \quad (10)$$

$$z_2(k) = \frac{4}{3T} \int_{kT_s}^{(k+1)T_s} y_{s2}(t)dt \quad (11)$$

$$z_3(k) = \frac{4}{3T} \int_{(k+1)T_s}^{(k+2)T_s} y_{s3}(t)dt \quad (12)$$

$$z_4(k) = \frac{4}{3T} \int_{(k+2)T_s}^{(k+3)T_s} y_{s4}(t)dt \quad (13)$$

Since there are $N_{cp}$ duty pulses within each bit duration 3T, $N_{cp}$ sampled data of the output of each matched filter are added by using the four summers 361, 362, 363, 364 to obtain four statistics $\Lambda_1$, $\Lambda_2$, $\Lambda_3$, $\Lambda_4$, which are given by:

$$\Lambda_1 = \sum_{k=1}^{N_{cp}} z_1(k) \quad (14)$$

$$\Lambda_2 = \sum_{k=1}^{N_{cp}} z_2(k) \quad (15)$$

$$\Lambda_3 = \sum_{k=1}^{N_{cp}} z_3(k) \quad (16)$$

$$\Lambda_4 = \sum_{k=1}^{N_{cp}} z_4(k) \quad (17)$$

An array of four absolute value generators 371, 372, 373, 374 are used to generate the absolute values of the four statistics $\Lambda_1$, $\Lambda_2$, $\Lambda_3$, $\Lambda_4$.

The absolute values $|\Lambda_1|, |\Lambda_2|, |\Lambda_3|$, and $|\Lambda_4|$ are compared in a magnitude comparator 381 with one another to find which one has the maximum value. If $|\Lambda_l|$ has the maximum value, it indicates that each pulse of the received $N_{cp}$ duty pulses is located at $PP_l$. The magnitude comparator 381 has four output bits $d_1$, $d_2$, $d_3$, $d_4$ (the use of four output bits is just for the convenience of presentation, actually two output bits is sufficient to indicate the results) used to indicate which statistic has the maximum absolute value. The values of these bits are assigned in accordance with the following criteria:

if $|\Lambda_1|$ is maximum, then $d_1=1$, $d_2=-1$, $d_3=-1$, $d_4=-1$;

if $|\Lambda_2|$ is maximum, then $d_1=-1$, $d_2=1$, $d_3=-1$, $d_4=-1$;

if $|\Lambda_3|$ is maximum, then $d_1=-1$, $d_2=-1$, $d_3=1$, $d_4=-1$; and if $|\Lambda_4|$ is maximum, then $d_1=-1$, $d_2=-1$, $d_3=-1$, $d_4=-1$.

The outputs of the summers 361, 362, 363, 364 are also connected to a switch circuit 390, which is capable of being controlled by $d_1$, $d_2$, $d_3$, $d_4$ to allow only one of its four input signals to pass there through. The selection is controlled by the four bits $d_1$, $d_2$, $d_3$, $d_4$ in such a manner that:

if $d_1=1$ and $d_2=d_3=d_4=-1$, $\Lambda_1$ is selected as the output, if $d_2=1$ and $d_1=d_3=d_4=-1$, $\Lambda_2$ is selected as the output, if $d_3=1$ and $d_1=d_2=d_4=-1$, $\Lambda_3$ is selected as the output, and if $d_4=1$ and $d_1=d_2=d_3=-1$, $\Lambda_4$ is selected as the output.

As a result, only one of the four statistics $\Lambda_1$, $\Lambda_2$, $\Lambda_3$, and $\Lambda_4$ that has the maximum absolute value is selected to pass through the switch circuit 390 and thereby compared by a comparator 382 to determine the polarity of the received duty pulse. The output of the comparator 382 is a binary signal denoted by $d_5$, where $d_5=1$ if $\Lambda_l \geq 0$, i.e., the input signal has a positive magnitude, and $d_5=-1$ if $\Lambda_l < 0$, i.e., the input signal has a negative magnitude.

The relationships of the five decision bits $(d_1,d_2,d_3,d_4,d_5)$ to the received duty pulse is listed in the following Table-B3:

TABLE B3

| Received Duty Pulse | | Decision Bits |
|---|---|---|
| Pulse Position | Polarity | $(d_1, d_2, d_3, d_4, d_5)$ |
| $PP_1$ | +1 | (1, −1, −1, −1, 1) |
| $PP_2$ | +1 | (−1, 1, −1, −1, 1) |
| $PP_3$ | +1 | (−1, −1, 1, −1, 1) |
| $PP_4$ | +1 | (−1, −1, −1, 1, 1) |
| $PP_4$ | −1 | (−1, −1, −1, 1, −1) |
| $PP_3$ | −1 | (−1, −1, 1, −1, −1) |
| $PP_2$ | −1 | (−1, 1, −1, −1, −1) |
| $PP_1$ | −1 | (1, −1, −1, −1, −1) |

In accordance with the relationships defined in Table-B2 and Table-B3, the bit pattern represented by the received $N_{cp}$ duty pulses can be determined after the five decision bits $(d_1,d_2,d_3,d_4,d_5)$ are determined. These are listed in the following Table-B4:

TABLE B4

| Decision Bits $(d_1, d_2, d_3, d_4, d_5)$ | Deciphered Bit Pattern $(\hat{b}_{3l}, \hat{b}_{3l+1}, \hat{b}_{3l+2})$ |
|---|---|
| (1, −1, −1, −1, 1) | (1, 1, 1) |
| (−1, 1, −1, −1, 1) | (1, 1, −1) |
| (−1, −1, 1, −1, 1) | (1, −1, 1) |
| (−1, −1, −1, 1, 1) | (1, −1, −1) |
| (−1, −1, −1, 1, −1) | (−1, 1, 1) |
| (−1, −1, 1, −1, −1) | (−1, 1, −1) |
| (−1, 1, −1, −1, −1) | (−1, −1, 1) |
| (1, −1, −1, −1, −1) | (−1, −1, −1) |

A logic circuit 401 is built to implement the truth table defined in Table-B4. The three parallel output bits of the logic circuit 401 can be converted into serial bit sequence by a parallel-to-serial converter 402 such that the data bit stream originally sent out from the data source is obtained. In FIG. 11, we show a modified receiver of the BPSK-TPP-DS-CDMA system. In this modified receiver, the ON/OFF modes of the switches $S_{11}$, and $S_{12}$ are controlled respectively by the pulse trains $CP_{11}(t)$ and $CP_{12}(t)$ shown in FIGS. 12A–12B, and the ON/OFF modes of the switches $S_{21}$, $S_{22}$, $S_{23}$, and $S_{24}$ are controlled respectively by the pulse trains $CP_{21}(t)$, $CP_{22}(t)$, $CP_{23}(t)$, and $CP_{24}(t)$ such that $S_{11}$=ON and $S_{12}$=OFF for $nT_s \leq t < (n+1)T_s$, $S_{11}$=OFF and $S_{12}$=ON for $(n+1)T_s \leq t < (n+2)T_s$, $S_{21}$=ON and $S_{22}=S_{23}=S_{24}$=OFF for $nT_{cp} \leq < nT_{cp}+T_s$, $S_{22}$=ON and $S_{21}=S_{23}=S_{24}$=OFF for $nT_{cp}+T_s \leq t < nT_{cp}+2T_s$, $S_{23}$=ON and $S_{21}$=$S_{22}$=$S_{24}$=OFF for $nT_{cp}+2T_s \leq t < nT_{cp}+3T_s$, $S_{24}$=ON and $S_{21}$=$S_{22}$=$S_{23}$=OFF for $nT_{cp}+3T_s \leq t < nT_{cp}+4T_s$, where n=0,1,2, ... A skilled engineer can see easily that the modified BPSK-TPP-DS-CDMA receiver shown in FIG. 11 has same function as BPSK-TPP-DS-CDMA receiver shown in FIG. 7B, and thus the detail description of this modified receiver thereof will not be given.

A Generalized BPSK-MPP-DS-CDMA System

A generalized M-ary system is shown in FIGS. 13A-13B, which is referred to as a BPSK-MPP-DS-CDMA system. The transmitter portion of the system is shown in FIG. 13A, and the receiver portion of the system is shown in FIG. 13B. The circuit structures for all systems with different selections of M are basically the same. Therefore, for the generalized M-ary system shown in FIGS. 13A-13B, only those components that are particularly related to the selected M will be described.

Referring to FIG. 13A, an M-bit serial-to-parallel converter 910 is used to convert the input serial data bit stream into M parallel bit streams, or in other words, into a sequence of M-bit vectors with the duration of each M-bit vector equals MT. As shown in FIG. 14A, a number $N_{cp}$ which is the period of a pseudorandom sequence signal $PN_p^i(t)$ to be used later for spectrum spreading is used to divide the duration MT into $N_{cp}$ equal intervals having a duration of $T_{cp}$, where $T_{cp}=MT/N_{cp}$. Each $T_{cp}$ is divided into $2^{M-1}$ pulse positions with each pulse position having a duration $T_s$ as shown in FIG. 14B; and the $2^{M-1}$ pulse positions are designated by $PP_l, l=1,2,\ldots,2^{M-1}$. Since each pulse position can accommodate either a positive pulse or a negative pulse, they built $2^M$ possible duty-pulse-train patterns so a one-to-one mapping relationship can be established between the bit pattern of an M-bit vector, which has $2^M$ possible combinations, and the $2^M$ possible duty-pulse-train patterns.

Referring back to FIG. 13B, the receiver portion of the M-ary system is structurally similar to that of FIG. 7B except that $I=2^{M-1}$ components, such as switches, matched filters, samplers, summers, and absolute value generators, may be used instead of four.

The demodulated signal $y_3(t)$ is sent to an array of I, $I=2^{M-1}$, switches which are sequentially triggered ON by $CP_l(t)$, l=1,2, ..., I, for a duration of $T_s$ at a period of $T_{cp}$. In subsequence to the switches, an array of I, $I=2^{M-1}$, matched filters 940, an array of I samplers 950, an array of I summers 960, and an array of I absolute value generators 970 are used. Functional operations of each component in the array is the same as that used in FIG. 3B or in FIG. 7B.

In FIG. 15, we show a modified receiver of the BPSK-MPP-DS-CDMA system. Functional operations of each component in the circuit is the same as that used in FIG. 11, so that the detail description of this modified receiver thereof will not be given.

Performance Evaluations

Under the condition that the signal energy used for one decision in the BPSK-DS-CDMA and BPSK-MPP-DS-CDMA systems is equal, through rigorous calculations, it is found that the BPSK-MPP-DS-CDMA system according to the present invention has three improved characteristics over the conventional BPSK-DS-CDMA system. These improved characteristics include:

(1) a reduction of cross-correlation noise,
(2) an increase in multiple access capacity, and
(3) a reduction in transmitting energy.

The cross-correlation noise is improved by a factor of $M2^{M-1}$:

4 if the system is based on M=2,
12 if the system is based on M=3,
32 if the system is based on M=4, and
80 if the system is based on M=5.

If the multiple access capacity is not limitted by the period $N_{cp}$ of the pseudorandom process $PN_p(t)$, then under the constraints of same bandwidth and same bit error rate, the multiple access capacity is improved by a factor at least of:

2 if the system is based on M=2,
5.34 if the system is based on M=3,
13.28 if the system is based on M=4,
26.4 if the system is based on M=5.

Conversely, if the multiple access capacity is limited by the $N_{cp}$, i.e., after the number of users attains $N_{cp}$, the extra reduction in cross-correlation noise can reduce the bit error rate of the system.

The transmitting energy of the BPSK-MPP-DS-CDMA system is only 1/M of the transmitting energy of the conventional BPSK-DS-CDMA system, and thus (M−1)/M of the transmitting energy is saved.

These improved characteristics are derived from theoretical evaluations using mathematical analyses. The theoretical evaluations on the conventional BPSK-DS-CDMA system shown in FIGS. 1A-1B will be given in the following section and the results are to be used to compare with the theoretical evaluations of the present invention system.

In the following evaluations, we will make three assumptions:

(1) J users are present in the communication channel and each user carries equal power, (2) the communication channel causes no attenuation on the strength of the transmitted signal, (3) coherent demodulation is employed in the receiver of the BPSK-MPP-DS-CDMA system.

These three assumptions are usually made in the performance analyses of academic literatures. Although these three assumptions will require the practical system to include power control systems, power amplifiers, and synchronization systems, they will not hurt the usefulness of the system. Therefore, we will also make the performance evaluations under these three assumptions.

(1) Performance Evaluation of the Conventional BPSK-DS-CDMA System

Figure 1A:
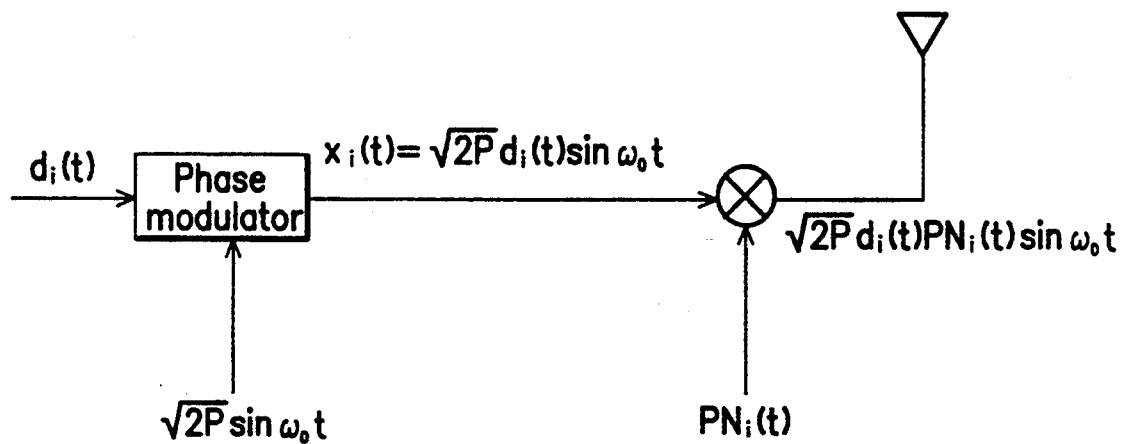
FIG. 1A shows the block diagram of a transmitter for the conventional BPSK direct sequence spread spectrum system.
Figure 1B:
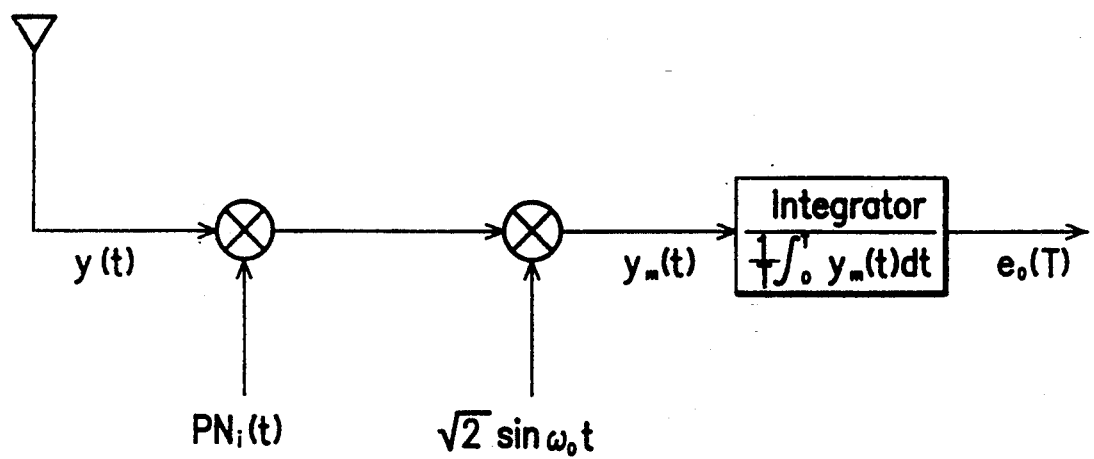
FIG. 1B shows the block diagram of a receiver for the conventional BPSK direct sequence spread spectrum system.
Figure 2:
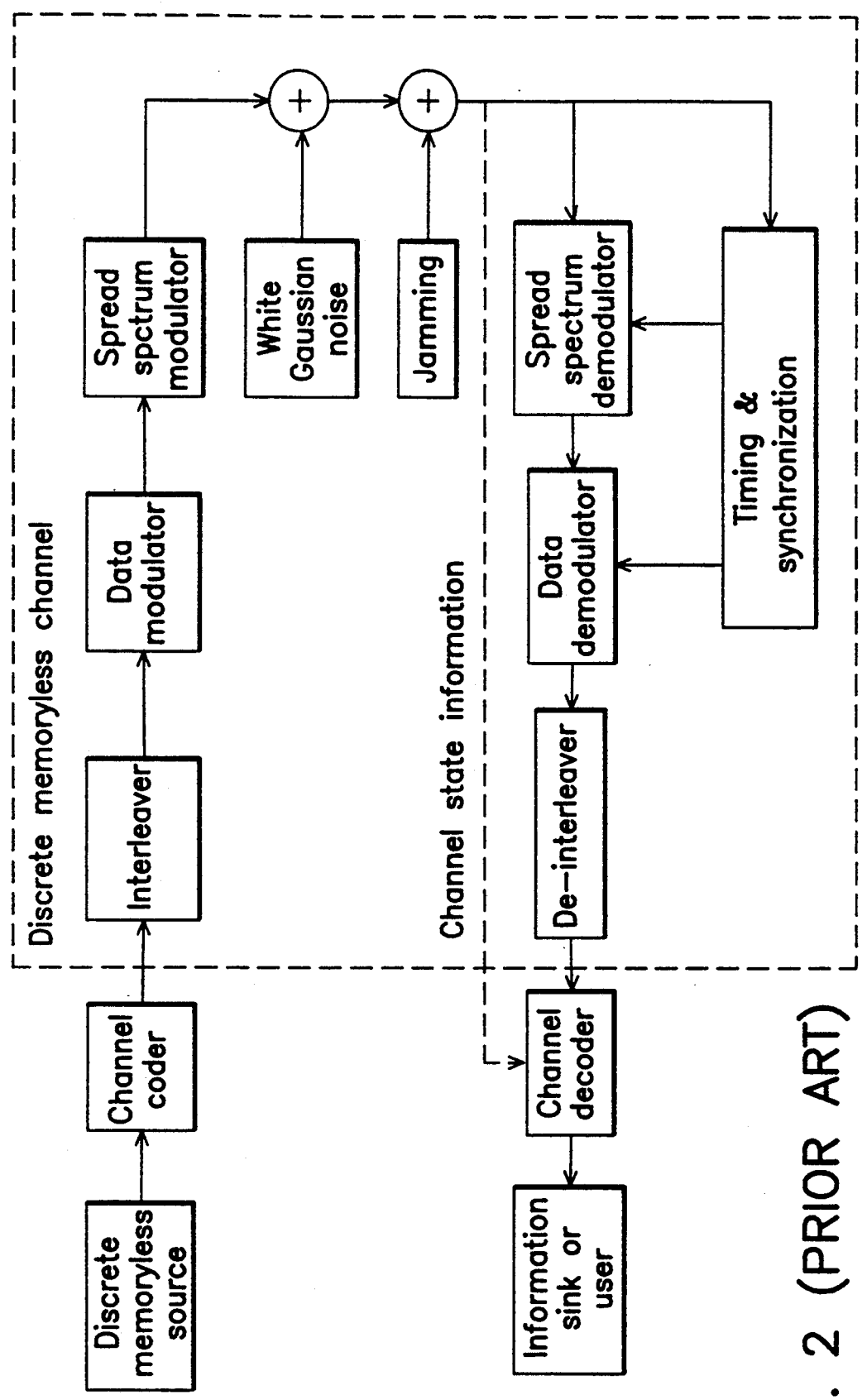
FIG. 2 shows a basic CDMA communication system model.

FIGS. 1A-1B show the conventional BPSK-DS-CDMA system. The $PN_i(t)$ in FIGS. 1A-1B is a sample of a pseudorandom process PN(t) having chip $T_c$ and period $N_c$. This $PN_i(t)$ is used as the signature of the i-th user and is used in FIG. 1A to modulate the signal $x_i(t)$. It also used in FIG. 1B to demodulate the received signal y(t). For the case that J users are present in the channel and each user carries equal power P, the received signal can be represented as $$y(t) = \quad (18)$$

-continued $$\sum_{j=1}^{J} \sqrt{2P}\, d_j(t - \tau_j)PN_j(t - \tau_j)\sin[\omega_0(t - \tau_j) + \phi_j] + n(t),$$

where $d_j(t)$ is the information data sequence having symbol duration of T seconds, $\tau_j$ is the transmission delay, $\phi_j$ is the random phase of the j-th transmitter, and n(t) is the additive white Gaussian noise. Since only relative time delays and phase angles need to be considered, $\phi_i$ and $\tau_i$ of the i-th transmitter can be assumed to be zero, i.e., $\phi_i=0$ and $\tau_i=0$.

Under the assumption of coherent demodulation, the signal before the matched filter (the integrator in FIG. B) of the i-th receiver is given by $$y_m(t) = \sqrt{P}\, d_i(t) + \sum_{j=1,j\neq i}^{J} \sqrt{P}\, d_j(t - \tau_j)PN_j(t)PN_i(t - \tau_j) \times \quad (19)$$

$$\cos(\omega_0\tau_j + \phi_j) + n(t)\sqrt{2}\, PN_i(t)\sin(\omega_0 t)$$

$$= \sqrt{P}\, d_i(t) + N_J(t) + n'(t)$$

where $\sqrt{P}d_i(t)$ is the signal component and $N_J(t)$ is called "the cross-correlation noise (CCN)." The $2\omega_0$ term is omitted in the above equation since it will be filtered out by the matched filter.

For rigorousness, two kinds of evaluations which are based respectively on the random model and pseudorandom model of the pseudorandom process PN(t) are summarized in the following subsections.

(A) Random Model Analysis

Since $\omega_0\tau_j$ and $\phi_j$ in Eq.(19) are uniformly distributed over $(0,2\pi)$, $\omega_0\tau_j$ can be included into $\phi_j$. Based on random NRZ code symbol sense and from the pertinent reference [4], the power spectral density (psd) of $PN_i(t)PN_j(t-\tau_j)\cos\phi_j$ is derived as $$S_c(f,\epsilon) = \quad (20)$$

$$\left\{ \frac{\epsilon^2}{T_c}\, \text{sinc}^2(\pi f \epsilon) + \frac{(T_c - \epsilon)^2}{T_c}\, \text{sinc}^2[\pi f(T_c - \epsilon)] \right\} \cos^2\phi_j$$

where $\epsilon = |\tau_j|$ (mod $T_c$). For $f=0$, we have $$S_c(0,\epsilon) = \frac{\epsilon^2 + (T_c - \epsilon)^2}{T_c}\, \cos^2\phi_j, \quad j \neq i. \quad (21)$$

Since $\epsilon$ and $\phi_j$ are uniformly distributed over $(0,T_c)$ and $(0,2\pi)$, respectively, the mean average of $S_c(0,\epsilon)$ equals $T_c/3$. For $T>>T_c$, the spreading effect of $d_j(t-\tau_j)$ on the CCN, i.e., $N_J(t)$, can be neglected and the two sided psd of the CCN around $f=0$ can be assumed to be a constant $N_J/2$ and is given by $$\frac{N_J}{2} \sum_{j=1,j\neq i}^{J} \frac{1}{3}\, PT_c = \frac{1}{3}\, (J-1)PT_c. \quad (22)$$

In the pertinent reference [5], Yao proved that the probability density function (pdf) of $N_J(t)$ is approximately Gaussian when the number of users is sufficiently large. This result is also justified in the pertinent reference [6]. Let $N_0/2$ be the two sided psd of n(t) and neglect the spreading effect of $PN_i(t)$ on n(t), the bit error rate of the receiver can be derived as $$P_b = Q\left(\sqrt{\frac{2E_b}{\frac{2}{3}(J-1)PT_c + N_0}}\right) = \quad (23)$$

$$Q\left(\sqrt{\frac{2PT}{\frac{2}{3}(J-1)PT_c + N_0}}\right)$$

where $E_b$ is the bit energy of $d_i(t)$ and Q(x) is the Q-function. Note that the bit energy $E_b$ is the energy used for each decision to determine whether the bit of the transmitted $d_i(t)$ is 1 or $-1$ and thus $E_b$ is defined as the energy used in one decision. Define the signal to noise ratio as $$SNR = \frac{2PT}{\frac{2}{3}(J-1)PT_c + N_0} \quad (24)$$

For $2(J-1)PT_c/3 >> N_0$, we have $$SNR = \frac{2PT}{\frac{2}{3}(J-1)PT_c} = \frac{3T}{(J-1)T_c} \quad (25)$$

(B) Pseudorandom Model Analysis

In the pertinent reference [8], Pursley gave a complete pseudorandom model analysis for the BPSK-DS-CDMA system. In this analysis, the binary data sequence $d_j(t)$ is represented as $$d_j(t) = \sum_{l=-\infty}^{\infty} b_l^j P_T(t - lT), \quad (26)$$

where $P_T(t)$ is a rectangular pulse of duration T which starts at $t=0$ and $b_l^j \in \{+1,-1\}$ for each l. Let $\tau_j = |\tau_j|$ (mod T). The output of the integrator times T, i.e., $e_o(T).T$, is then given by $$E_i = \sqrt{P} \int_0^T d_i(t)dt + \sqrt{P} \sum_{j=1,j\neq i}^{J} [f_{ji}(\tau_j) + \hat{f}_{ji}(\tau_j)]\cos\phi_j + \eta_i \quad (27)$$

where $\eta_i$ is the random variable $$\eta_i = \int_0^T \sqrt{2}\, n(t)PN_i(t)\sin(\omega_0 t)dt, \quad (28)$$

and the functions $f_{ji}$ and $\hat{f}_{ji}$ are defined respectively as $$f_{ji}(\tau) = b_{-1}^j \int_0^\tau PN_j(t - \tau)PN_i(t)dt \quad 0 \leq t < \tau \quad (29)$$

and $$\hat{f}_{ji}(\tau) = b_0^j \int_\tau^T PN_j(t - \tau)PN_i(t)dt \quad \tau \leq t < T \quad (30)$$

In Eq.(29) and Eq.(30) $b_{-1}^j$ and $b_0^j$ are two consecutive data bits from the j-th data source. By defining two continuous-time partial crosscorrelation functions $$R_{ji}(\tau) = \int_0^\tau PN_j(t - \tau)PN_i(t)dt, \quad 0 \leq \tau < T \quad (31)$$

$$\hat{R}_{ji}(\tau) = \int_{\tau}^{T} PN_j(t - \tau)PN_i(t)dt, \quad 0 \leq \tau < T \quad (32)$$

the normalized multiple-access interference due to the transmitted signal of j-th user at the output of the i-th receiver, i.e., the j-th component in the second term of Eq.(27) divided by $\sqrt{PT}$, can be written as $$I_{ji}(\underline{b}_j,\tau_j,\phi_j) = T^{-1}[b_{-1}{}^j R_{ji}(\tau_j) + b_0{}^j \hat{R}_{ji}(\tau_j)]\cos\phi_j \quad (33)$$

where $\underline{b}_j$ is defined as the vector $(b_{-1}{}^j, b_0{}^j)$. If the prior probabilities $P\{b_{-1}{}^j=1\}$ and $P\{b_0{}^j=1\}$ are all equal to $\frac{1}{2}$, the mean and variance of $I_{ji}(\underline{b}_j,\tau_j,\phi_j)$ are then given by $$E\{I_{ji}(b_j,\tau_j,\phi_j)\} = 0 \quad (34)$$

and $$\sigma_{ji}^2 = \text{Var}\{I_{ji}(b_j, \tau_j, \phi_j)\} \quad (35)$$

$$= \frac{1}{2} \cdot T^{-3} \left\{ \int_0^T [R_{ji}^2(\tau) + \hat{R}_{ji}^2(\tau)] d\tau \right\}$$

Represent $PN_j(t)$ as $$PN_j(t) = \sum_{k=-\infty}^{\infty} a_k{}^j \psi(t - kT_c) \quad (36)$$

where $a_k{}^j$ is the j-th signature sequence, and $\psi(t)$ is the chip waveform for which $$T_c^{-1} \int_0^{T_c} \psi^2(t)dt = 1. \quad (37)$$

Then $$R_{ji}(\tau) = \sum_{k=0}^{l-1} a_{N_p-l+k}^j a_k^i \int_{\tau'}^{T_c} \psi(t)\psi(t - \tau')dt + \quad (38)$$

$$\sum_{k=0}^{l-1} a_{N_p-l+k}^j a_k^i \int_0^{\tau'} \psi(t)\psi(t + T_c - \tau')dt$$

$$= R_{ji}^A(\tau) + R_{ji}^B(\tau)$$

and $$\hat{R}_{ji}(\tau) = \sum_{k=0}^{N_p-1-l} a_k^j a_{k+l}^i \int_{\tau'}^{T_c} \psi(t)\psi(t - \tau')dt + \quad (39)$$

$$\sum_{k=0}^{N_p-1-l'} a_{+k}^j a_{k+l'}^i \int_0^{\tau'} \psi(t)\psi(t + T_c - \tau')dt$$

$$= \hat{R}_{ji}^A(\tau) + \hat{R}_{ji}^B(\tau)$$

where $l = [\tau/T_c], l' = l+1$, and $\tau' = \tau - lT_c$. The notation [u] used is to denote the integer part of the real number u. Assuming that a positive pulse is transmitted, i.e., $b_0{}^i = 1$, we have $$\text{Var}\{E_i/b_0{}^i = 1\} = \frac{N_0}{2} T + PT^2 \sum_{j=1,j\neq i}^{J} \sigma_{ji}^2 \quad (40)$$

The signal-to-noise ratio of the i-th receiver is then defined as $$SNR_i = E^2\{E_i/b_0{}^i = 1\}[\text{Var}\{E_i/b_0{}^i = 1\}]^{-1} \quad (41)$$

After some simple manipulation, it yields $$SNR_i = \left( \frac{N_0}{2PT} + \sum_{j=1,j\neq i}^{J} \sigma_{ji}^2 \right)^{-1} = \quad (42)$$

$$\left( \frac{N_0}{2E_b} + \sum_{j=1,j\neq i}^{J} \sigma_{ji}^2 \right)^{-1}$$

As a result, the bit error rate can be written as $$P_b \approx Q\left( \sqrt{\frac{1}{\left(\frac{N_0}{2E_b} + \sum_{j=1,j\neq i}^{J} \sigma_{ji}^2\right)}} \right) \quad (43)$$

For a rectangular chip waveform and a tradeoff between the parameters J, $N_p$, and $E_b/N_0$ is carried out for preliminary system design, the signal to noise ratio is derived to be $$SNR_i \approx \left( \frac{J-1}{3N_p} + \frac{N_0}{2E_b} \right)^{-1}, \quad (44)$$

where $N_p = T/T_c$. Comparing Eq.(44) to the SNR defined in Eq.(24) these two quantities are identical.

(2) Performance Evaluation of the BPSK-BPP-DS-CDMA System of the Present Invention (M=2)

FIGS. 3A–3B show the BPSK-BPP-DS-CDMA system. The $PN_p{}^i(t)$ in FIGS. 3A–3B is a sample of a pseudorandom process $PN_p(t)$ which has period $N_{cp}$ and chip $T_{cp}$. The index p is used to distinguish the process $PN_p(t)$ from the pseudorandom process PN(t) used in the conventional BPSK-DS-CDMA system. The $PN_p{}^i(t)$ is used as the signature of the i-th user. In FIG. 3A, the binary data signal $d_i(t)$ is multiplexed by the serial-to-parallel converter 210 into two parallel data sequences $$d_{i1}(t) = \sum_{l=-\infty}^{\infty} b_{2l} P_{2T}(t - 2lT) \quad (45)$$

and $$d_{i2}(t) = \sum_{l=-\infty}^{\infty} b_{2l+1} P_{2T}(t - 2lT) \quad (46)$$

where $P_{2T}(t)$ has a duration 2T. For the purpose of comparision, the bandwidths used in the conventional BPSK-DS-CDMA and BPSK-BPP-DS-CDMA system are assumed to be the same. Also, the amount of energy used for one decision in both systems are assumed to be equal to PT. The transmitted signal $x_3(t)$ in FIG. 3A can then be written as $$x_3(t) = \sqrt{2P} \, PN_c{}^i(t)\sin\omega_0 t \quad (47)$$

where $\omega_0$ is the carrier frequency and $$PN_c{}^i(t) = \quad (48)$$

-continued $$\left\{ \sum_{l=-\infty}^{\infty} \sum_{k=1}^{N_{cp}} d_l^i P_u^m[t-(k-1)T_{cp}-2lT]P_{2T}(t-2lT) \right\} PN_p^i(t).$$

where $$P_u^m(t) = \begin{cases} 1 & (m-1)T_s < t \leq mT_s \\ 0 & \text{elsewhere,} \end{cases} \quad (49)$$

and m equals 1 or 2 which depends on the vector $(b_{2l},b_{2l+1})$ and $d_l^i \in \{1,-1\}$. Since $b_{2l},b_{2l+1} \in \{+1,-1\}$ for each l, $PN_c^i(t)$ possesses four possible duty-pulse-train patterns, $PN_{cn}^i(t)$, n=1,2,3, and 4 in each [0,2T] interval. These patterns can be visualized as obtained by multiplying the waveforms shown in FIGS. 4A–4D with $PN_p^i(t)$.

For the case that J users are present in the channel, the received signal can then be represented as $$y_1(t) = \sum_{j=1}^{J} \sqrt{2P} \, PN_c^j(t-\tau_j)\sin[\omega_0(t-\tau_j)+\phi_j] + n(t) \quad (50)$$

From FIGS. 4A–4D, we can see that the signal can present in PP$_1$ or PP$_2$ only, thus we define two hypotheses H$_1$: The signal present in PP$_1$,
H$_2$: The signal present in PP$_2$.

Then the two statistics $\Lambda_1$ and $\Lambda_2$ at the outs of Summers 261 and 262 in FIG. 3B under hypotheses H$_1$ and H$_2$ are given by $$\begin{align} H_1: \; \Lambda_1 &= \pm\sqrt{P} + I_1 + \eta_1; \quad \Lambda_2 = I_2 + \eta_2 \\ H_2: \; \Lambda_1 &= I_1 + \eta_1; \quad \Lambda_2 = \pm\sqrt{P} + I_2 + \eta_2 \end{align} \quad (51)$$

where the polarity of $\sqrt{P}$ is determined by the polarity of $PN_c^i(t)PN_p^i(t)$, and $I_1,I_2,\eta_1$, and $\eta_2$ are defined as $$I_1 = \quad (52)$$

$$\frac{1}{T}\int_0^{2T}\sqrt{P} \sum_{j=1,j\neq i}^{J} d_j(t-\tau_j)PN_c^j(t-\tau_j)PN_p^i(t)P_u^1(t)\cos\phi_j dt$$

$$I_2 = \quad (53)$$

$$\frac{1}{T}\int_0^{2T}\sqrt{P} \sum_{j=1,j\neq i}^{J} d_j(t-\tau_j)PN_c^j(t-\tau_j)PN_p^i(t)P_u^2(t)\cos\phi_j dt$$

$$\eta_1 = \frac{1}{T}\int_0^{2T}\sqrt{2}\, n(t)PN_p^i(t)P_u^1(t)\sin(\omega_0 t)dt \quad (54)$$

and $$\eta_2 = \frac{1}{T}\int_0^{2T}\sqrt{2}\, n(t)PN_p^i(t)P_u^2(t)\sin(\omega_0 t)dt \quad (55)$$

Clearly, I$_1$ and I$_2$ are due to the CNN in PP$_1$ and PP$_2$, respectively. The output of the subtracter 280 is $\Lambda = |\Lambda_1| - \Lambda_2$. The decision rule of the comparator 291 is $$d_1 = \begin{cases} +1 & \text{if } \Lambda \geq 0 \\ -1 & \text{if } \Lambda < 0 \end{cases} \quad (56)$$

The switches S$_3$ and S$_4$ are controlled by d$_1$ as follows
1. S$_3$ on and S$_4$ off if d$_1$=1.
2. S$_3$ off and S$_4$ on if d$_1$=−1.

As a consequence of these operations, the decision rule of the comparator 292 is given by $$d_2 = \begin{cases} 1 & \text{if } \Lambda_1 \geq 0 \text{ or } \Lambda_2 \geq 0 \\ -1 & \text{if } \Lambda_1 < 0 \text{ or } \Lambda_2 < 0 \end{cases} \quad (57)$$

As a result, the estimate $(\hat{b}_{2l}, \hat{b}_{2l+1})$ of $(b_{2l}, b_{2l+1})$ can be obtained from Table-A4.

2.1 The Power Spectral Densities Associated with the Transmitted Waveforms

From FIGS. 4A–4D, we can see that the duty pulses present only in PP$_1$ or PP$_2$ and can conclude that $PN_{c3}^i(t) = -PN_{c2}^i(t)$ and $PN_{c4}^i(t) = -PN_{c1}^i(t)$. Based on these properties and model $PN_p(t)$ as a random process, the psd of $PN_c^i(t)$ can then be derived as $$S_c(f) = \frac{T_s}{2}\text{sinc}^2(\pi f T_s). \quad (58)$$

From the pertinent reference [4], the psd of the long direct sequence signal PN(t) is given by $$S_{PN}(f) = T_c \sin c^2(\pi f T_c) \quad (59)$$

Thus, if $T_s = T_c$, the bandwidth of BPSK-DS-CDMA and BPSK-BPP-DS-CDMA are equal and $S_c(f) = S_{PN}(f)/2$.

In order to discuss the influence of I$_1$ and I$_2$ on the performance of the system, we need to derive the psd of $d_j(t-\tau_j)PN_c^j(t-\tau_j)PN_p^i(t)P_u^m(t)\cos\phi_j$. It is equivalent to find the psd $S_c^{ji}(f,\epsilon)$ of the cross correlated waveform $d_j(t-\epsilon)PN_c^j(t-\epsilon)PN_c^i(t)\cos\phi_j$, where $\epsilon = |\tau_j|$ (mod $T_{cp}$). Since T>>T$_c$, the effect of $d_j(t)$ on $S_c^{ji}(f,\epsilon)$ can be neglected. Then based on the properties of the transmitted waveforms $PN_c^i(t)$ and model $PN_p(t)$ as a random process, we have $$S_c^{ji}(f,\epsilon) = \quad (60)$$

$$\frac{1}{4}\left\{ \frac{(T_s-\epsilon)^2}{T_s}\text{sinc}^2[\pi f(T_s-\epsilon)] + \frac{\epsilon^2}{T_s}\text{sinc}^2(\pi f \epsilon) \right\}\cos^2\phi_j$$

where $0 \leq \epsilon < T_s$. Then $$S_c^{ji}(0,\epsilon) = \frac{1}{4}\left[\frac{(T_s-\epsilon)^2}{T_s} + \frac{\epsilon^2}{T_s}\right]\cos^2\phi_j \quad (61)$$

For $T_s = T_c$ and compared Eq.(61) to Eq.(21), we have $$S_c^{ji}(0,\epsilon) = \frac{1}{4}S_c(0,\epsilon) \quad (62)$$

For T>>T$_s$, the two-sided psd of CCN in PP$_1$ and PP$_2$ around f=0 can be considered as a constant N$_{JP}$/2. Since the amplitude of the transmitted signal within the duty period is $\sqrt{2P}$, which is the same as the amplitude of the signal used in the conventional system, we have $$\frac{N_{JP}}{2} = \frac{1}{4}\left[\frac{1}{3}(J-1)PT_s\right] \tag{63}$$

For discussing the characteristics of $\eta_1$ and $\eta_2$, we consider the psd of $n(t)PN_p{}^i(t)P_u{}^m(t)$. It is equivalent to finding the psd of $n(t)PN_c{}^i(t)$. For $T \gg T_s$, the two sided psd of $n(t)PN_c{}^i(t)$ near $f=0$ can be approximately by a constant $N_n/2$. It can be found from $$\frac{1}{2}N_n = \left[\frac{N_0}{2} * S(f)\right]_{f=0} = \frac{T_s}{2}\left[\frac{N_0}{2} * \text{sinc}^2(\pi f T_s)\right]_{f=0} \tag{64}$$

$$= KN_0/4$$

where * represents the convolution operation, and K is a constant. From the pertinent reference [7] we know that $K \approx 1$. Thus $PN_c{}^i(t)$ has a 3 dB spreading effect on white noise.

Let $N_I/2$ represents the two sided psd of the total interference noise before the matched filters 241, 242, then $$\frac{N_I}{2} = \frac{1}{4}\left[\frac{1}{3}(J-1)PT_s\right] + \frac{1}{2}\left[\frac{N_0}{2}\right] \tag{65}$$

2.2 The Signal to Noise Radio of the BPSK-BPP-DS-CDMA System

Just like Eq.(24), from Eq.(65) the signal to noise ratio of the BPSK-BPP-DS-CDMS system $$SNR = \frac{2PT}{\frac{1}{4}\left[\frac{2}{3}(J-1)PT_s\right] + \frac{N_0}{2}} \tag{66}$$

For $(J-1)PT_s/6 \gg N_0/2$, we have $$SNR = \frac{2PT}{\frac{1}{4}\left[\frac{2}{3}(J-1)PT_s\right]} \tag{67}$$

Compared Eq.(67) to Eq.(25), we can see that the SNR is improved by a factor of 4.

2.3 Pseudorandom Model Analysis of BPSK-BPP-DS-CDMA System

Just as with the conventional BPSK-DS-CDMA system, Pursley's theory will be employed in this analysis. The normalized multiple-access interference in $PP_n$, $I_{ji}{}^n(\underline{d}_j, \tau_j, \phi_j)$, due to the j-th signal can then be written as $$I_{ji}{}^1(\underline{d}_j,\tau_j,\phi_j) = T^{-1}[d_{-1}{}^j R_{ji}{}^1(\tau_j) + d_0{}^j \hat{R}_{ji}{}^1(\tau_j)]\cos\phi_j \tag{68}$$

$$I_{ji}{}^2(\underline{d}_j,\tau_j,\phi_j) = T^{-1}[d_{-1}{}^j R_{ji}{}^2(\tau_j) + d_0{}^j \hat{R}_{ji}{}^2(\tau_j)]\cos\phi_j \tag{69}$$

where $\underline{d}_j$ is defined as the vector $(d_{-1}{}^j, d_0{}^j)$ and $d_{-1}{}^j, d_0{}^j$ are two consecutive data bits of $PN_c{}^i(t)$ defined in Eq.(48). The functions $R_{ji}{}^1$, $\hat{R}_{ji}{}^1$, $R_{ji}{}^2$, and $\hat{R}_{ji}{}^2$ can be derived respectively as $$\hat{R}_{ji}^1(\tau) = \frac{1}{2}\left\{\frac{1}{2}\left[\sum_{k=0}^{l-1} d_{N_{cp}-l+k}^j a_k^i \int_{\tau'}^{T_{sc}} \psi_1^i(t)\psi_1^j(t-\tau')dt + \right.\right. \tag{70}$$

$$\sum_{k=0}^{l-1} d_{N_{cp}-l+k}^j a_k^i \int_{\tau'-T_{sc}}^{T_{sc}} \psi_1^i(t)\psi_2^j(t+T_{cp}-\tau')dt\right] +$$

$$\frac{1}{2}\left[\sum_{k=0}^{l-1} d_{N_{cp}-l+k}^j a_k^i \int_0^{\tau'-T_{sc}} \psi_1^i(t)\psi_1^j(t+T_{cp}-\tau')dt + \right.$$

$$\left.\left.\sum_{k=0}^{l-1} d_{N_{cp}-l+k}^j a_k^i \int_0^{\tau'} \psi_1^i(t)\psi_2^j(t+T_{cp}-\tau')dt\right]\right\}$$

$$= \frac{1}{2}\left\{\frac{1}{2}\hat{R}_{ji}^{1A} + \frac{1}{2}\hat{R}_{ji}^{1B}\right\}$$

$$R_{ji}^1(\tau) = \frac{1}{2}\left\{\frac{1}{2}\left[\sum_{k=0}^{N_{cp}-1-l} a_k^j a_{k+l}^i \int_{\tau'}^{T_{sc}} \psi_1^i(t)\psi_1^j(t-\tau')dt + \right.\right. \tag{71}$$

$$\sum_{k=0}^{N_{cp}-1-l} a_k^j a_{k+l}^i \int_{\tau'-T_{sc}}^{T_{sc}} \psi_1^i(t)\psi_2^j(t+T_{cp}-\tau')dt\right] +$$

$$\frac{1}{2}\left[\sum_{k=0}^{N_{cp}-1-l} a_k^j a_{k+l}^i \int_0^{\tau'-T_{sc}} \psi_1^i(t)\psi_1^j(t+T_{cp}-\tau')dt + \right.$$

$$\left.\left.\sum_{k=0}^{N_{cp}-1-l'} a_k^j a_{k+l'}^i \int_0^{\tau'} \psi_1^i(t)\psi_2^j(t+T_{cp}-\tau')dt\right]\right\}$$

$$= \frac{1}{2}\left[\frac{1}{2}R_{ji}^{1A} + \frac{1}{2}R_{ji}^{1B}\right]$$

$$\hat{R}_{ji}^2(\tau) = \frac{1}{2}\left\{\frac{1}{2}\left[\sum_{k=0}^{l-1} d_{N_{cp}-l+k}^j a_k^i \int_{\tau'}^{T_{cp}} \psi_2^i(t)\psi_1^j(t-\tau')dt + \right.\right. \tag{72}$$

$$\sum_{k=0}^{l-1} d_{N_{cp}-l+k}^j a_k^i \int_{T_{sc}+\tau'}^{T_{cp}} \psi_2^i(t)\psi_2^j(t-\tau')dt\right] +$$

$$\frac{1}{2}\left[\sum_{k=0}^{l-1} d_{N_{cp}-l+k}^j a_k^i \int_{T_{sc}}^{T_{sc}+\tau'} \psi_2^i(t)\psi_1^j(t-\tau')dt + \right.$$

$$\left.\left.\sum_{k=0}^{l-1} d_{N_{cp}-l+k}^j a_k^i \int_{T_{sc}}^{\tau'} \psi_2^i(t)\psi_2^j(t+T_{cp}-\tau')dt\right]\right\}$$

$$= \frac{1}{2}\left[\frac{1}{2}\hat{R}_{ji}^{2A} + \frac{1}{2}\hat{R}_{ji}^{2B}\right]$$

and $$R_{ji}^2(\tau) = \frac{1}{2}\left\{\frac{1}{2}\left[\sum_{k=0}^{N_{cp}-1-l} a_k^j a_{k+l}^i \int_{\tau'}^{T_{cp}} \psi_2^i(t)\psi_1^j(t-\tau')dt + \right.\right. \tag{73}$$

$$\sum_{k=0}^{N_{cp}-1-l} a_k^j a_{k+l}^i \int_{T_{sc}+\tau'}^{T_{sc}} \psi_2^i(t)\psi_2^j(t-\tau')dt \Bigg] +$$

$$\frac{1}{2}\left[\sum_{k=0}^{N_{cp}-1-l'} a_k^j a_{k+l'}^i \int_{T_{sc}}^{T_{sc}+\tau'} \psi_2^i(t)\psi_1^j(t-\tau')dt + \right.$$

$$\left.\left.\sum_{k=0}^{N_{cp}-1-l'} a_k^j a_{k+l'}^i \int_{T_{sc}}^{\tau'} \psi_2^i(t)\psi_2^j(t+T_{cp}-\tau')dt\right]\right\}$$

$$= \frac{1}{2}\left[\frac{1}{2}R_{ji}^{2A} + \frac{1}{2}R_{ji}^{2B}\right]$$

where, for convenience, the subscript j of $\tau_j$ has been omitted.

Unfortunately, no exact conclusion can be obtained from Eq.(70) to Eq.(73). The reason is that $R_{ji}^1(\tau)$, $R_{ji}^2(\tau)$, $\hat{R}_{ji}^1(\tau)$, and $\hat{R}_{ji}^2(\tau)$ are all expressed as the average of all possible cases. However, it is reasonable to assume that $$\frac{1}{2}R_{ji}^{1A} = \frac{1}{2}R_{ji}^{2A} = R_{ji}^A \tag{74}$$

$$\frac{1}{2}R_{ji}^{1B} = \frac{1}{2}R_{ji}^{2B} = R_{ji}^B \tag{75}$$

$$\frac{1}{2}\hat{R}_{ji}^{1A} = \frac{1}{2}\hat{R}_{ji}^{2A} = \hat{R}_{ji}^A \tag{76}$$

and $$\frac{1}{2}\hat{R}_{ji}^{1B} = \frac{1}{2}\hat{R}_{ji}^{2B} = \hat{R}_{ji}^B \tag{77}$$

where $R_{ji}^A$, $R_{ji}^B$, $\hat{R}_{ji}^A$, and $\hat{R}_{ji}^B$ are defined in Eq.(38) and (39). As a result, we have $$R_{ji}^1(\tau) = R_{ji}^2(\tau) = \frac{1}{2}R_{ji}(\tau) \tag{78}$$

and $$\hat{R}_{ji}^1(\tau) = \hat{R}_{ji}^2(\tau) = \frac{1}{2}\hat{R}_{ji}(\tau) \tag{79}$$

where $R_{ji}(\tau)$ and $\hat{R}_{ji}(\tau)$ are defined in Eq.(38) and (39). Since $$(\sigma'_{ji})^2 = \text{Var}\{I_{ji}^1(d_j, \tau_j, \phi_j)\} \tag{80}$$

$$= \frac{1}{2}T^{-2}\left\{\int_0^T T^{-1}[(R_{ji}^1(\tau))^2 + (\hat{R}_{ji}^1(\tau))^2]d\tau\right.$$

and $$(\sigma''_{ji})^2 = \text{Var}\{I_{ji}^2(d_j, \tau_j, \phi_j)\} \tag{81}$$

$$= \frac{1}{2}T^{-2}\left\{\int_0^T T^{-1}[(R_{ji}^2(\tau))^2 + (\hat{R}_{ji}^2(\tau))^2]d\tau,\right.$$

we have $\sigma_{ji}' = \sigma_{ji}'' = \sigma_{ji}/2$, where $\sigma_{ji}$ is defined in Eq.(35).

Just like Eq.(41), the signal-to-noise ratios in the pulse positions $PP_1$ and $PP_2$ are defined respectively as $$SNR_1^i = E^2\{\Lambda_1/H_1\}\{Var\{\Lambda_1/H_1\}\}^{-1}, \tag{82}$$

and $$SNR_2^i = E^2\{\Lambda_2/H_2\}\{Var\{\Lambda_2/H_2\}\}^{-1}. \tag{83}$$

We can find $$E\{\Lambda_1/H_1\} = E\{\Lambda_2/H_2\} = \sqrt{P}, \tag{84}$$

$$\text{Var}\{\Lambda_1/H_1\} = \frac{N_0}{4T} + P\sum_{j=1,j\neq i}^{J}(\sigma'_{ji})^2, \tag{85}$$

and $$\text{Var}\{\Lambda_2/H_2\} = \frac{N_0}{4T} + P\sum_{j=1,j\neq i}^{J}(\sigma''_{ji})^2. \tag{86}$$

Since the amounts of energy used for one decision in the BPSK-DS-CDMA and BPSK-BPP-DS-CDMA systems are the same, we obtain $$SNR_1^i = SNR_2^i = 4\left(\frac{N_0}{E_b} + \sum_{j=1,j\neq i}^{J}(\sigma''_{ji})^2\right)^{-1} \tag{87}$$

Since $2\sigma_{ji}'' = \sigma_{ji}$, then $SNR_1^i = SNR_2^i = 4SNR_i$ for $\Sigma_{j=1,j\neq i}^J(2\sigma_{ji}'')^2 >> N_0/E_b$, where $SNR_i$ is defined in Eq.(42). Thus the signal to noise radio is improved by a factor of 4. It is identical to the result obtained in the random model analysis.

2.4 Bit Error Probability of BPSK-BPP-DS-CDMA System

By considering the hypotheses testing of $H_1$ and $H_2$, it can be shown that the error rate $P_{e1}$ of the comparator 291 satisfies $$P_{e1} < UP_{e1} \tag{88}$$

where $$UP_{e1} = 2Q\left(\frac{\sqrt{P}}{\sqrt{2}\,\sigma_I}\right) \tag{89}$$

and $\sigma_I = (N_I/2T)^{0.5}$. Note that $N_I/2$ is given in Eq.(65).

To discuss the performance of comparator 292, we assume that $b_{2l}=1$ is transmitted. From Table-A4, we know that $\hat{b}_{2l}=1$ occurs when $\{d_1=1, d_2=1\}$ or $\{d_1=-1, d_2=1\}$.

Therefore, $$P\{\hat{b}_{2l} = 1/b_{2l} = 1\} = P\{d_1 = 1, d_2 = 1\} + \quad (90)$$
$$P\{d_1 = -1, d_2 = 1\}$$
$$= P\{d_2 = 1/d_1 = 1\}P\{d_1 = 1\} +$$
$$P\{d_2 = 1/d_1 = -1\}P\{d_1 = -1\},$$

where P{X} denote the probability of the set X. If the comparator 291 makes a wrong decision, then the statistic $\Lambda_1$ or $\Lambda_2$ contains only interference noise. Hence we have $$P\{d_2 = 1/d_1 = -1, H_1\} = \tfrac{1}{2} \quad (91)$$

Let $P_{e2} = P\{d_2 = -1/d_1 = 1, H_1\}$. Then $$P\{\hat{b}_{2l} = 1/b_{2l} = 1, H_1\} = (1 - P_{e1})(1 - P_{e2}) + \tfrac{1}{2} P_{e1} \quad (92)$$
$$= 1 - \left(P_{e2} + \tfrac{1}{2} P_{e1}\right) + P_{e1}P_{e2}$$

and $$P\{\hat{b}_{2l} = -1/b_{2l} = 1, H_1\} = P_{e2} + \tfrac{1}{2} P_{e1} - P_{e1}P_{e2} \quad (93)$$

Note that
$P\{\hat{b}_{2l} = -1/b_{2l} = 1, H_2\} = P\{\hat{b}_{2l} = -1/b_{2l} = 1, H_1\}$. Assuming that $b_{2l}$ and $b_{2l+1}$ are independent and $P\{b_{2l} = 1\} = P\{b_{2l} = -1\} = P\{b_{2l+1} = 1\} = P\{b_{2l+1} = -1\} =$, the bit error rate of BPSK-BPP-DC-CDMS is then given by $$P_e = P_{e2} + P_{e1}\left(\tfrac{1}{2} - P_{e2}\right) \quad (94)$$

Thus $$P_e < P_{e2} + UP_{e1}\left(\tfrac{1}{2} - P_{e2}\right) \quad (95)$$

Since the Comparator 292 performs the detection of bipolar signaling when comparator 291 has made a correct decision and $UP_{e1}/2$ is equal to the error rate of the detection of the corresponding unipolar signaling, we have $UP_{e1} \geq 100 P_{e2}$ for $P_{e2} < 10^{-4}$. Because $P_{e2} < 10^{-4}$ is usually required in practice, we can use $P_{e2} + UP_{e1}(\tfrac{1}{2} - P_{e2}) \approx UP_{e1}/2$ in the following discussion. As a result, $$P_e < \tfrac{1}{2} UP_{e1} = Q\left(\sqrt{\frac{2E_b}{\tfrac{1}{2}\left[\tfrac{2}{3}(J-1)PT_s\right] + N_0}}\right) \quad (96)$$

The $E_b = PT$ in Eq.(96) is the energy used for one decision. However, it is the energy of $x_3(t)$, defined in Eq.(47), within 2T interval.

Compared Eq.(96) to Eq.(23) under same bandwidth and quality constraint, i.e., $T_s = T_c$ and same bit error rate, we have the following conclusion: If $(J-1)PT_s/3 >> N_0$, the multiple-access capacity can be increased by at least a factor of 2.

Furthermore, by inspecting the waveform of FIG. 5A, we can see that the transmitted signal present only in PP$_1$ or PP$_2$ and the amplitude of the transmitted signal is also equal to $\sqrt{2P}$, thus half of the transmitting energy is saved.

(3) Performance Evaluations of the BPSK-TPP-DS-CDMA System of the Present Invention (M=3)

FIGS. 7A-7B show the BPSK-TPP-DS-CDMA system. The PN$_p{}^i$(t) in these figures is also a sample of a pseudorandom process PN$_p$(t) having chip T$_{cp}$ and period N$_{cp}$. This PN$_p{}^i$(t) is also used as the signature of the i-th user. As the BPSK-BPP-DS-CDMA system, for the purpose of comparison, the bandwidths and the amount of energy used for one decision in the conventional BPSK-DS-CDMA and BPSK-TPP-DS-CDMA systems are assumed to be the same. The bandwidth constraint is equivalent to the condition of $T_s = T_c$, where $T_s = T_{cp}/4$. Since $T = N_c T_c$ and $3T = N_{cp} T_{cp}$, we have $N_{cp} = 3N_c/4$. Though this is impossible in practice, it causes no problems in theory. Therefore the above condition will be accepted in the following discussions. Since the BPSK-TPP-DS-CDMA system is structurally and functionally similar to the BPSK-BPP-DS-CDMA system, the definitions of transmitted waveform PN$_c{}^i$(t) and its possible duty-pulse-train patterns PN$_{cn}{}^i$(t) are similarly defined and thus will not be redescribed here. From FIGS. 8A-8H, we can see that the signal can present only in PP$_1$, PP$_2$, PP$_3$, or PP$_4$, thus we define four hypotheses H$_1$: The signal present in interval PP$_1$,
H$_2$: The signal present in interval PP$_2$,
H$_3$: The signal present in interval PP$_3$,
H$_4$: The signal present in interval PP$_4$.

Let $\epsilon = |\tau_j|$ (mod $T_{cp}$). We will then point out a very important property of the cross-correlated waveform PN$_c{}^j$(t−$\epsilon$)PN$_c{}^i$(t). Specifically, PN$_{c1}{}^j$(t−$\epsilon$)PN$_{c1}{}^i$(t) is plotted in FIGS. 16A-16B. We can see from these figures that the resulting pulse duration decreases from T$_s$ to 0 when $0 < \epsilon \leq T_s$, stays at zero for $T_s < \epsilon \leq 3T_s$, and then increases from 0 to T$_s$ when $3T_s < \epsilon \leq T_{cp}$. In other words, the psd $S_{c1}{}^{ji}(f, \epsilon)$ of PN$_{c1}{}^j$(t−$\epsilon$)PN$_{c1}{}^i$(t)cos $\phi_j$ is nozero for $0 < \epsilon \leq T_s$ and $3T_s < \epsilon \leq T_{cp}$ but is zero for $T_s < \epsilon \leq 3T_s$. Based on these properties and employing the technique used in BPSK-BPP-DS-CDMA system, the signal-to-noise ratio in PP$_1$, PP$_2$, PP$_3$, or PP$_4$, of the BPSK-TPP-DS-CDMA system can be derived as $$SNR = \frac{2PT}{\tfrac{1}{12}\left[\tfrac{2}{3}(J-1)PT_s\right] + \tfrac{N_0}{4}} \quad (97)$$

For $(J-1)PT_s/9 >> N_0/2$, we have $$SNR = \frac{2PT}{\tfrac{1}{12}\left[\tfrac{2}{3}(J-1)PT_s\right]} \quad (98)$$

Compared Eq.(98) to Eq.(25), that is compared to the SNR of the conventional BPSK-DS-CDMA system, the SNR is improved by a factor of 12.

Similar as the conventional BPSK-DS-CDMA and BPSK-BPP-DS-CDMA systems, Pursley's theory is employed in the pseudorandom model analysis of the BPSK-TPP-DS-CDMA system. Then we can find $$E\{\Lambda_n/H_n\} = \sqrt{\frac{4P}{3}} \quad (99)$$

and

-continued $$\text{Var}\{\Lambda_n/H_n\} = \frac{N_0}{8T_{tp}} + \frac{4P}{3} \sum_{j=1, j\neq i}^{J} (\sigma_{ji}^n)^2. \quad (100)$$

where $T_{tp}=3T/4$. Define the signal-to-noise ratio in the pulse position $PP_n$, $n=1,2,3,4$, as $$SNR_n = E^2\{\Lambda_n/H_n\}\{Var\{\Lambda_n/H_n\}\}^{-1}. \quad (101)$$

Then $$SNR_n = 12\left\{ \frac{3N_0}{2E_b} + \sum_{j=1, j\neq i}^{J} (\sigma_{ji})^2 \right\}^{-1}. \quad (102)$$

Comparing Eq.(102) to Eq.(42), if $\Sigma_{j=1,j\neq i}^{J}(\sigma_{ji})^2 >> 3N_0/2E_b$, then $SNR_n = 12SNR_i$, where $SNR_i$ is defined as in Eq.(42). Thus, compared to the conventional system, the signal to noise ratio is improved by a factor of 12. This is identical to the result obtained in random model analysis.

By considering the hypotheses testing of $H_k$, $k=1,2,3,4$, just like with the BPSK-BPP-DS-CDMA system, we can find that the bit error rate $P_e$ of the BPSK-TPP-DS-CDMA system satisfies $$P_e < \frac{1}{2} UP_{IW} = 3Q\left( \sqrt{ \frac{2E_b}{\frac{1}{6}\left[\frac{2}{3}(J-1)PT_s\right] + \frac{N_0}{2}} } \right). \quad (103)$$

The $E_b$ in Eq.(103) is the amount of energy used for one decision in the BPSK-TPP-DS-CDMA system. For $Q(.)=10^{-6}$, the factor 3 in $3Q(.)$ of Eq.(103) is approximately equivalent to a 0.5 dB reduction in SNR. In other words, the SNR is reduced by a factor of 0.89. Comparing the argument of the Q-function in Eq.(103) to Eq.(23) under same bandwidth and quality constraint, i.e., $T_s=T_c$ and same bit error rate, we have the following conclusion:

If $(J-1)PT_s/9 >> N_0/2$ in Eq.(103) and $2(J-1)PT_c/3 >> N_0$ in Eq.(23), the multiple access capacity of the proposed system is increased by at least a factor of $0.89 \times 6 = 5.34$ over the conventional system.

Furthermore, the amplitude of the transmitted signal is $\sqrt{8P/3}$ and can present only in $PP_1$, $PP_2$, $PP_3$, or $PP_4$, thus two-thirds of the transmitting energy is saved.

(4) Performance Evaluation of The BPSK-MPP-DS-CDMA System of the Present Invention FIGS. 13A–13B show the BPSK-MPP-DS-CDMA system. The $PN_p^i(t)$ in these two figures is a sample of a pseudorandom process $PN_p(t)$ having chip $T_{cp}$ and period $N_{cp}$. This $PN_p^i(t)$ is used as the signature of the i-th user. We know from the BPSK-BPP-DS-CDMA and BPSK-TPP-DS-CDMA systems that each chip $T_{cp}$ will be divided into I, $I=2^{M-1}$, pulse positions and are designated as $PP_1$, $PP_2$, ..., and $PP_I$ in the M-ary system. Thus we define I hypothes $H_l$, $l=1,2,...,I$, as in the BPSK-BPP-DS-CDMA and BPSK-TPP-DS-CDMA systems. Since a positive or negative pulse can present in each pulse positions, the transmitted waveforms $PN_c^i(t)$ consists of 2I, $2I=2^M$, possible duty-pulse-train patterns, $PN_{cn}^i(t)$, $n=1,2,\ldots,2I$.

Let $d_i(t)$ denote the binary data signal to be transmitted to the communication channel. It can be represented as $$d_i(t) = \sum_{l=-\infty}^{\infty} b_l^i P_T(t - lT) \quad (104)$$

where $P_T(t)$ is a rectangular pulse of duration T which starts at $t=0$ and $b_l^i \in \{+1,-1\}$ for each l. This $d_i(t)$ is converted by the M-bit serial-to-parallel converter 910 into M parallel data sequences as follows:

$$d_{im}(t) = \sum_{l=-\infty}^{\infty} b_{Ml+m-1} P_{MT}(t - MlT) \quad (105)$$

where $m=1,2,\ldots,M$, and $P_{MT}(t)$ has duration MT. We thus formed a sequence of vectors $B_M=(b_{Ml},b_{Ml+1},\ldots,b_{Ml+M-1})$ with the duration of the vector $B_M$ equal to MT. Since $b_l \in \{1,-1\}$ for every l, there are 2I possible vectors within every MT duration.

Just as with the BPSK-BPP-DS-CDMA and BPSK-TPP-DS-CDMA systems, we assign each $PN_{cn}^i(t)$ to one of the 2I possible $B_M$ vectors. The transmitted signal $x_3(t)$ can then be represented as $$x_3(t) = \sqrt{\frac{2IP}{M}} PN_c^i(t)\sin(\omega_0 t) \quad (106)$$

For the case where J users are present in the channel, the received signal can be represented as $$y(t) = \sum_{j=1}^{J} \sqrt{\frac{2IP}{M}} PN_c^j(t - \tau_j)\sin[\omega_0(t - \tau_j) + \phi_j] + n(t) \quad (107)$$

where $PN_c^j(t)$ is the transmitted waveform of the j-th user. Since only relative time delays and phase angles need to be considered, $\phi_i$ and $\tau_i$ of the i-th transmitter can be assumed to be zero, i.e., $\phi_i=0$ and $\tau_i=0$.

Then under the assumption of coherent demodulation, we make the performance evaluation of BPSK-MPP-DS-CDMA system.

4.1 The Power Spectral Densities Associated With the Transmitted Waveforms (A) Power Spectral Density of the MPP-DS Waveform Just as with the BPSK-BPP-DS-CDMA system, if we consider $PN_p(t)$ as a random process, the psd of $PN_c^i(t)$ can then be derived as $$S_t(f) = \frac{T_s}{I} \text{sinc}^2(\pi f T_s). \quad (108)$$

$T_s=T_c$, the bandwidths of the BPSK-DS-CDMA and BPSK-MPP-DS-CDMA system are the same and $S_t(f)=S_{PN}(f)/I$, where $S_{PN}(f)$ is defined in Eq.(59).

(B) Power Spectral Density of the Decross-Correlated Waveforms

Since the psd of the decross-correlated waveforms is very important in the performance evaluations of the BPSK-MPP-DS-CDMA system, we have used two methods to derive them. One of the methods consider $PN_p(t)$ as a pseudorandom process and the pad of the decross-correlated waveform $PN_c^j(t-\epsilon)PN_c^i(t)\cos\phi_j$ can be derived as $$S_{cc}^{ji}(f, \epsilon) = \frac{1}{I} [S_{c11}^{ji}(f) + S_{cn}^{ji}(f)]\cos^2\phi_j \qquad (109)$$

where $$S_{c11}^{ji}(f) = \frac{(N_{cp}+1)(T_s-\epsilon)^2}{(N_{cp}T_{cp})^2} \text{sinc}^2[\pi f(T_s - \epsilon)] \sum_{l=-\infty}^{\infty} \delta\left(f + \frac{l}{N_{cp}T_{cp}}\right) - \qquad (110)$$

$$\frac{(T_s-\epsilon)^2}{N_{cp}T_{cp}^2} \text{sinc}^2[\pi f(T_s-\epsilon)] \sum_{l=-\infty}^{\infty} \delta\left(f + \frac{l}{T_{cp}}\right),$$

$$S_{cn}^{ji}(f) = \frac{(N_{cp}+1)\epsilon^2}{(N_{cp}T_{cp})^2} \text{sinc}^2(\pi f \epsilon) \sum_{l=-\infty}^{\infty} \delta\left(f + \frac{l}{N_{cp}T_{cp}}\right) - \qquad (111)$$

$$\frac{\epsilon^2}{N_{cp}T_{cp}^2} \text{sinc}^2(\pi f \epsilon) \sum_{l=-\infty}^{\infty} \delta\left(f + \frac{l}{T_{cp}}\right),$$

where $0 < \epsilon \leq T_s$. Thus we have $$S_{cc}^{ji}(0, \epsilon) = \frac{1}{I}\left[\frac{(T_s-\epsilon)^2}{N_{cp}^2 T_{cp}^2} + \frac{\epsilon^2}{N_{cp}^2 T_{cp}^2}\right]\cos^2\phi_j \qquad (112)$$

and $$S_{cc}^{ji}\left(\pm\frac{1}{N_{cp}T_{cp}}, \epsilon\right) = \frac{1}{I}\left[\frac{(T_s-\epsilon)^2}{N_{cp}T_{cp}^2} + \frac{\epsilon^2}{N_{cp}T_{cp}^2}\right]\cos^2\phi_j, \qquad (113)$$

For the another method, we consider $PN_p(t)$ as a random rather than pseudorandom process, then the psd $S_c^{ji}(f)$ of $PN_c^j(t-\epsilon)PN_c^i(t)\cos\phi_j$ is derived to be $$S_c^{ji}(f, \epsilon) = \frac{1}{I^2}\left\{\frac{(T_s-\epsilon)^2}{T_s}\text{sinc}^2[\pi f(T_s-\epsilon)] + \frac{\epsilon^2}{T_s}\text{sinc}^2(\pi f \epsilon)\right\}\cos^2\phi_j \qquad (114)$$

where $0 < \epsilon \leq T_s$. Thus we have $$S_c^{ji}(0, \epsilon) = \frac{1}{I^2}\left[\frac{(T_s-\epsilon)^2}{T_s} + \frac{\epsilon^2}{T_s}\right]\cos^2\phi_j. \qquad (115)$$

Compared Eq.(115) to Eq.(112) and Eq.(113) we have $$S_c^{ji}(0, \epsilon) \times \frac{1}{N_{cp}T_{cp}} = S_{cc}^{ji}\left(\pm\frac{1}{N_{cp}T_{cp}}, \epsilon\right). \qquad (116)$$

Therefore, if we neglect the special phenomenon of $S_{cc}^{ji}(f,\epsilon)$ at $f=0$, the $S_{cc}^{ji}(f,\epsilon)$ can be considered as discretized from $S_c^{ji}(f,\epsilon)$. These provide a check of the results. For convenience, we will use $S_c^{ji}(f,\epsilon)$ in the following discussions. Compared Eq.(115) to Eq.(21), we have $$S_c^{ji}(0, \epsilon) = \frac{1}{I^2} S_c(0, \epsilon). \qquad (117)$$

Since the power transmitted by the duty pulses of the BPSK-MPP-DS-CDMA system is IP/M, from Eq.(117) and Eq.(22) the two-sided psd around $f=0$ of the CCN within each $PP_l$, $l=1,2,\ldots,I$, can be considered as a constant $N_{JP}/2$ and can be written as $$\frac{N_{JP}}{2} = \frac{1}{MI}\left[\frac{1}{3}(J-1)PT_s\right]. \qquad (118)$$

Notice that $N_{JP}/2$ is $1/MI$ of the $N_J/2$ defined in Eq.(22). In other words, the psd of CCN in the BPSK-MPP-DS-CDMA system is $1/MI$ of the psd of CCN in the conventional BPSK-DS-CDMA system.

(C) The Spreading Effect of $PN_c(t)$ on White Noise

Consider the psd of $n(t)PN_c(t)$. For $T \gg T_s$, the two-sided psd of $n(t)PN_c(t)$ near $f=0$ can be approximated by a constant $N_n/2$. It can be found from $$\frac{N_n}{2} = \left[\frac{N_0}{2} * S_t^i(f)\right]_{f=0} = \frac{T_s}{I}\left[\frac{N_0}{2} * \text{sinc}^2(\pi f T_s)\right]_{f=0} \qquad (119)$$

$$= \frac{KN_0}{2I}$$

where K is a constant. From the pertinent reference [7], we know that $K \approx 1$.

4.2 The Signal to Noise Ratio of the BPSK-MPP-DS-CDMA System

Similar as Eq.(66), from Eq.(118) and Eq.(119) the signal-to-noise ratio in every pulse position $PP_l$, $l=1,2,\ldots I$, of the BPSK-MPP-DS-CDMA system is given by $$SNR = \frac{2PT}{\frac{1}{MI}\left[\frac{2}{3}(J-1)PT_s\right] + \frac{N_0}{I}} \qquad (120)$$

For $2(J-1)PT_s/3M \gg N_0$, we have $$SNR = \frac{2PT}{\frac{1}{MI}\left[\frac{2}{3}(J-1)PT_s\right]} \qquad (121)$$

Comparing Eq.(121) to Eq.(25), that is, compared to the SNR of the conventional BPSK-DS-CDMA system, the SNR is improved by a factor of MI.

4.3 Pseudorandom Model Analysis of the BPSK-MPP-DS-CDMA System

The mathematics involved in the pseudorandom model analysis is very complicated and it would be similar to that in the BPSK-BPP-DS-CDMA and BPSK-TPP-DS-CDMA systems. So to perform the related analysis for a particular M-ary system would be fairly straightforward. Therefore, we have omitted it here.

4.4 Bit Error Rate of the BPSK-MPP-DS-CDMA System

Let $P(|\Lambda_2|<|\Lambda_1|,\ldots,|\Lambda_I|<|\Lambda_1|/|\Lambda_1|,H_1)$ denote the joint probability that $|\Lambda_2|,\ldots,|\Lambda_I|$ are all less than $|\Lambda_1|$ assuming $|\Lambda_1|$ and $H_1$. Then the probability of a correct decision of Magnitude Comparator 980 under hypothesis H₁ is $$P_{c/H_1} = \int_0^\infty P\{|\Lambda_2| < |\Lambda_1|, \ldots, |\Lambda_I| < \qquad (122)$$

$$|\Lambda_1|/\Lambda_1, H_1\} f_{|\Lambda_1|/H_1}(\lambda_1/H_1) d\lambda_1.$$

Since the prior probabilities $P(H_k), k=1,2,\ldots,I$, are equal, the probability of a correct decision $P_c$ of Magnitude Comparator 980 is equal to $P_{c/H_1}$. Let $P_{IC}$ denote the probability of a correct decision of Magnitude Comparator 980 under the assumption that $\Lambda_1, \Lambda_2 \ldots$ and $\Lambda_I$ are independent. Then $$P_{IC} \geq \left\{ 1 - 2Q\left(\frac{\sqrt{\frac{IP}{M}}}{\sqrt{2}\,\sigma_I}\right) \right\}^{(I-1)} \qquad (123)$$

On the other hand, let $P_{IW}$ denote the corresponding probability of a wrong decision of Magnitude Comparator 980. Then, $$P_{IW} \leq (I-1) \cdot 2Q(A) - \frac{I(I-1)}{2!} \cdot (2Q(A))^2 \ldots + (2Q(A))^{I-1} \qquad (124)$$

where $A = \sqrt{IP/M}/\sqrt{2}\sigma_I$. In practice, $Q(A) < 10^{-4}$. Thus we have $$P_{IW} \leq (I-1) \cdot 2Q(A) \qquad (125)$$

Let $$UP_{IW} = 2(I-1)Q(A). \qquad (126)$$

Similar as BPSK-BPP-DS-CDMA and BPSK-TPP-DS-CDMA systems, we have $P_W < P_{IW} < UP_{IW}$, where $P_W$ is the probability of a wrong decision of Magnitude Comparator 980. Therefore, as Eq.(96) or Eq.(103) the bit error rate of the BPSK-MPP-DS-CDMA system satisfies $$P_e < \frac{1}{2} UP_{IW} = \qquad (127)$$

$$(I-1)Q\left(\sqrt{\frac{2E_b}{\frac{2}{MI}\left[\frac{2}{3}(J-1)PT_s\right] + \frac{2N_0}{I}}}\right).$$

The $E_b$ in Eq.(127) is the energy used for one decision in the BPSK-MPP-DS-CDMA system. For $Q(.)=10^{-6}$, the factor $(I-1)$ is approximately equivalent to a $R_E$ dB reduction in SNR. Then $10^{-0.1R_E}$ is the factor of SNR reduction. For M=3, 4, and 5, the related parameters are given in Table-C1:

TABLE C1

| M | I-1 | $R_E$ | $10^{-0.1R_E}$ | F |
|---|-----|-------|----------------|------|
| 3 | 3   | 0.5   | 0.89           | 5.34 |
| 4 | 7   | 0.8   | 0.83           | 13.28 |
| 5 | 15  | 1.8   | 0.66           | 26.40 |

Comparing Eq.(127) to Eq.(23), that is, compared to the bit error rate of the conventional BPSK-DS-CDMA system under same bandwidth and bit error rate conditions, we arrive at the following conclusion:

For $Q(.)=10^{-6}$ and that the multiple access capacity is not limited by the period $N_{cp}$ of the pseudorandom sequence $PN_p^i(t)$ used in the BPSK-MPP-DS-CDMA system, i.e., the number of users is less than $N_{cp}$, if $2(J-1)PT_s/3M >> N_0$, the multiple access capacity in the system of present invention is improved by at least a factor of $F=MI10^{-0.1R_E}/2$ over the conventional system. Some of the specific results are also presented in Table-C1.

Conversely, if the number of users attains $N_{cp}$, the extra improvement in signal to interference noise ratio can not cause the multiple access capacity to increase any more, but the bit error rate will be reduced.

Furthermore, from FIG. 14B we can see that the duty pulse in the transmitted duty pulse train is present in only one of $2^{M-1}$ pulse positions and the power in the transmitted duty pulse is IP/M, therefore (M−1)/M of the transmiting energy can be saved.

The present invention has been described hitherto with exemplary preferred embodiments. However, it is to be understood that the scope of the present invention need not be limited to these disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A method of transmitting and receiving a serial data bit stream in a communication system, comprising the steps of:

(a) converting each group of M consecutive bits of a serial data bit stream which is to be transmitted to a receiver of the communication system into M parallel bits with a bit duration equal to M×T, where "x" is a multiplication indicator and T is a time duration of a bit in the serial data bit stream, and forming an M-bit vector from the M parallel bits according to a predetermined positive integer M larger than 1, such that serial M-bit vectors converted from serial groups of M consecutive bits form a sequence of M-bit vectors with every M-bit vector having said bit duration equal to M×T;

(b) selecting a pseudorandom sequence process $PN_p(t)$ which has a sequence period $N_{cp}$, where $N_{cp}$ is a positive integer;

(c) dividing each said bit duration equal to M×T by the sequence period $N_{cp}$ of the pseudorandom sequence process $PN_p(t)$ into $N_{cp}$ intervals with the time duration of each interval equal to a chip duration $T_{cp}$ of the pseudorandom sequence process $PN_p(t)$, where $T_{cp} = M \times T/N_{cp}$, where "/" is a division indicator;

(d) dividing each of the chip duration $T_{cp}$ into $2^{M-1}$ pulse positions, each pulse position having a time duration $T_s$, where $T_s = T_{cp}/2^{M-1}$;

(e) defining a mapping table by which each M-bit vector formed in Step (a) is converted during each said bit duration equal to M×T into a package of $N_{cp}$ duty pulses, thus forming a duty pulse package with each duty pulse appearing at a pulse position, which is one of the $2^{M-1}$ pulse positions in each $T_{cp}$ and with a predetermined pulse polarity, the duty pulse packages and the duty pulses in each duty pulse package being generated sequentially to form a duty pulse train;

(f) modulating the duty pulse train formed at Step (e) with a pseudorandom sequence signal $PN^i_p(t)$ to form a pulse-position-modulated-direct-sequence, where $PN^i_p(t)$ is a sample of the pseudorandom process $PN_p(t)$ defined at Step (b);

(g) modulating the pulse-position-modulated-direct-sequence formed in Step (f) with a carrier signal to form a carrier modulated signal and transmitting the carrier modulated signal over a channel of the communication system;

(h) receiving as a received carrier modulated signal the carrier modulated signal which is transmitted via the communication channel from the transmitting portion of the communication system;

(i) recovering the $N_{cp}$ duty pulses in each duty pulse package formed in Step (e) from the received carrier modulated signal by demodulating the received carrier modulated signal synchronously with a local generated carrier signal and pseudorandom sequence signal $PN^i_p(t)$;

(j) determining pulse position and polarity of the $N_{cp}$ duty pulses in each duty pulse package received, and determining accordingly by using the mapping table defined in Step (e) in a reverse manner the M-bit vector represented by each duty pulse package received; and (k) converting each M-bit vector determined at step (j) to corresponding M consecutive bits of the serial data bit stream.

2. A method of transmitting a serial data bit stream from a data source to a communication channel in code-division-multiple-access communication system, comprising the steps of:

(a) converting each group of M consecutive bits in the serial data bit stream which is to be transmitted to a receiver of the communication system into M parallel bits with a bit duration equal to M×T, where "x" is a multiplication indicator and T is the time duration of a bit in the serial data bit stream, and forming an M-bit vector from the M parallel bits according to a predetermined positive integer larger than 1, such that serial M-bit vectors converted from serial groups of M consecutive bits form a sequence of M-bit vectors with every M-bit vector having said bit duration equal to M×T;

(b) selecting a pseudorandom sequence process $PN_p(t)$ which has a sequence period $N_{cp}$, where $N_{cp}$ is a positive integer;

(c) dividing each said bit duration equal to M×T by the sequence period $N_{cp}$ of the pseudorandom sequence process $PN_p(t)$ into $N_{cp}$ intervals with the time duration of each interval equal to a chip duration $T_{cp}$, of the pseudorandom sequence process $PN_p(t)$, where $T_{cp} = M \times T/N_{cp}$, where "/" is a division indicator;

(d) dividing each of the chip duration $T_{cp}$ into $2^{M-1}$ pulse positions, each pulse position having a time duration $T_S$, $T_S = T_{cp}/2^{M-1}$;

(e) defining a mapping table by which each of the M-bit vectors formed at step (a) is converted during each said bit duration equal to M×T into a package of $N_{cp}$ duty pulses, thus forming a duty pulse package with each duty pulse appearing at a pulse position, which is one of the $2^{M-1}$ pulse positions in each $T_{cp}$, and with a predetermined pulse polarity, the duty pulse packages and the duty pulses in each duty pulse package being generated sequentially to form a duty pulse train;

(f) modulating the duty pulse train formed at step (e) with a pseudorandom sequence signal $PN^i_p(t)$ to form a pulse-position-modulated-direct-sequence, where $PN^i_p(t)$ is a sample of the pseudorandom sequence process $PN_p(t)$ defined at step (b);

(g) modulating the pulse-position-modulated-direct-sequence formed at step (f) with a carrier signal to form a carrier modulated signal, and transmitting the carrier modulated signal to a communication channel of the communication system.

3. A method of recovering a serial data bit stream from a communication channel in a pulse-position-modulated-direct-sequence code-division-multiple-access communication system, comprising the steps of:

(a) receiving as a received carrier modulated signal a carrier modulated signal which is transmitted via the communication channel from a transmitting portion of the pulse-position-modulated-direct-sequence code-division-multiple-access communication system;

(b) recovering $N_{cp}$ duty pulses in each duty pulse package from the received carrier modulated signal by demodulating the received carrier modulated signal synchronously with a local generated carrier signal and pseudorandom sequence signal $PN^i_p(t)$, where $N_{cp}$ is a sequence period of a predetermined pseudorandom sequence process $PN_p(t)$ and the pseudorandom sequence signal $PN^i_p(t)$ is a sample of the predetermined pseudorandom sequence process $PN_p(t)$, the sequence period $N_{cp}$ being a positive integer;

(c) determining pulse position and pulse polarity of the $N_{cp}$ duty pulses in each duty pulse package received, and determining accordingly by using a predetermined mapping table in a reverse manner the M-bit vector represented by each received duty pulse package, where M is a positive integer larger than 1; and (d) converting each M-bit vector to corresponding M consecutive bits of the serial data bit stream.

4. The method of claim 1, wherein the carrier signal is a sinusoidal signal.

5. An apparatus for transmitting a serial data bit stream from a data source to a communication channel in a code-division-multiple-access communication system, comprising: a serial-to-parallel converter for converting the serial data bit stream into two parallel bit streams and sending out a sequence of 2-bit vectors formed from the two parallel bit streams;

a pulse-position-modulated-direct-sequence modulator for modulating the sequence of 2-bit vectors to a pulse-position-modulated-direct-sequence which has two pulse positions in each chip duration of a pseudorandom sequence signal and has a pulse position of duty pulses in a duty pulse package determined by the 2-bit vector; and a carrier modulator for modulating the pulse-position-modulated-direct-sequence to a modulated signal by a carrier signal and for transmitting the modulated signal to the communication channel.

6. The apparatus of claim 5, wherein said pulse-position-modulated-direct-sequence modulator includes
a duty pulse encryptor for converting each 2-bit vector to a duty pulse package; and a pulse modulator for modulating output signals of said duty pulse encryptor with the pseudorandom sequence signal.

7. An apparatus for transmitting a serial data bit stream from a data source to a communication channel in a code-division-multiple-access communication system, comprising:
- a serial-to-parallel converter for converting the serial data bit stream into three parallel bit streams and for sending out a sequence of 3-bit vectors formed from the three parallel bit streams;
- a pulse-position-modulated-direct-sequence modulator for modulating the sequence of 3-bit vectors to a pulse-position-modulated-direct-sequence which has four pulse positions in each chip duration of a pseudorandom sequence signal and has a pulse position of duty pulses in a duty pulse package determined by the 3-bit vector; and
- a carrier modulator for modulating the pulse-position-modulated-direct-sequence to a modulated signal by a carrier signal and for transmitting the modulated signal to the communication channel.

8. The apparatus of claim 7, wherein said pulse-position-modulated-direct-sequence modulator includes:
- a duty pulse encryptor for converting each of 3-bit vectors to a duty pulse package; and
- a pulse modulator for modulating output signals of said duty pulse encryptor with the pseudorandom sequence signal.

9. An apparatus for transmitting a serial data bit stream from a data source to a communication channel in a code-division-multiple-access communication system, comprising:
- a serial-to-parallel converter for converting the serial data bit stream into M parallel bit streams, where M is a predetermined positive integer larger than 1, and for sending out a sequence of M-bit vectors formed from the M parallel bit streams;
- a pulse-position-modulated-direct-sequence modulator for modulating the sequence of M-bit vectors to a pulse-position-modulated-direct-sequence which has $2^{M-1}$ pulse positions in each chip duration of a pseudorandom sequence signal and has a pulse position of duty pulses in a duty pulse package determined by the M-bit vector; and
- a carrier modulator for modulating the pulse-position-modulated-direct-sequence to a modulated signal by a carrier signal and for transmitting the modulated signal to the communication channel.

10. The apparatus of claim 9, wherein said pulse-position-modulated-direct-sequence modulator includes:
- a duty pulse encryptor for converting each M-bit vectors to a duty pulse package as duty pulse encryptor output signals; and
- a pulse modulator for modulating the duty pulse encryptor output signals with the pseudorandom sequence signal.

11. An apparatus of transmitting a serial data bit stream from a data source to a communication channel in a code-division-multiple-access communication system, comprising:
- means for converting the serial data bit stream into M parallel bit streams, so that a sequence of M-bit vectors is formed from the M parallel bit streams, where M is a predetermined positive integer larger than 1;
- means for modulating the sequence of M-bit vectors to a pulse-position-modulated-direct-sequence which has $2^{M-1}$ pulse positions in each chip duration of a pseudorandom sequence signal and has a pulse position of duty pulses in a duty pulse package determined by the M-bit vector; and
- means for modulating the pulse-position-modulated-direct-sequence to a modulated signal by a carrier signal and for transmitting the modulated signal to the communication channel.

12. The apparatus of claim 11, wherein said pulse-position-modulated-direct-sequence modulating means includes:
- a duty pulse encryptor for converting each of M-bit vectors to a duty pulse package; and
- a pulse modulator for modulating output signals of said duty pulse encryptor with the pseudorandom sequence signal.

13. The apparatus of claim 5, wherein the carrier signal is a sinusoidal signal.

* * * * *